(12) United States Patent
Koyama et al.

(10) Patent No.: US 7,429,776 B2
(45) Date of Patent: Sep. 30, 2008

(54) SEMICONDUCTOR DEVICE AND METHOD FOR MANUFACTURING THE SAME

(75) Inventors: Masato Koyama, Miura-gun (JP); Akira Nishiyama, Yokohama (JP); Yoshinori Tsuchiya, Yokohama (JP); Reika Ichihara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 11/235,246

(22) Filed: Sep. 27, 2005

(65) Prior Publication Data
US 2006/0197157 A1    Sep. 7, 2006

(30) Foreign Application Priority Data
Mar. 3, 2005    (JP)    ............... 2005-059396

(51) Int. Cl.
*H01L 29/78*    (2006.01)
(52) U.S. Cl. ........................ 257/407; 257/412
(58) Field of Classification Search ................ 257/351, 257/407, 412
See application file for complete search history.

(56) References Cited

U.S. PATENT DOCUMENTS

| | | | |
|---|---|---|---|
| 5,247,193 A | * | 9/1993 | Menda .................... 257/85 |
| 6,876,045 B2 | * | 4/2005 | Takagi .................... 257/408 |
| 7,064,066 B1 | * | 6/2006 | Metz et al. ................ 438/680 |
| 2005/0116230 A1 | * | 6/2005 | Cabral et al. .............. 257/69 |
| 2006/0084217 A1 | * | 4/2006 | Luo et al. ................. 438/199 |
| 2006/0163630 A1 | * | 7/2006 | Callegari et al. .......... 257/295 |
| 2006/0192258 A1 | * | 8/2006 | Tsuchiya et al. .......... 257/412 |
| 2006/0197157 A1 | | 9/2006 | Koyama et al. |

FOREIGN PATENT DOCUMENTS

JP    2004-207481    7/2004

OTHER PUBLICATIONS

U.S. Appl. No. 11/461,646, filed Aug. 1, 2006, Koyama et al.
J. K. Schaeffer, et al., "Challenges for the Integration of Metal Gate Electrodes", IEDM Tech. Dig., 2004, pp. 287-290.
H.-H. Tseng, et al., "Improved Short Channel Device Characteristics with Stress Relieved Pre-Oxide (SRPO) And a Novel Tantalum Carbon Alloy Metal Gate/HfO$_2$ Stack", IEDM Tech. Dig., 2004, pp. 821-824.

* cited by examiner

*Primary Examiner*—Douglas M Menz
(74) *Attorney, Agent, or Firm*—Oblon, Spivak, McClelland, Maier & Neustadt, P.C.

(57) ABSTRACT

There is disclosed a semiconductor device comprising a P-channel MIS transistor which includes an N-type semiconductor layer, a first gate insulating layer formed on the N-type semiconductor layer and containing a carbon compound of a metal, and an N-channel MIS transistor which includes a P-type semiconductor layer, a second gate insulating layer formed on the P-type semiconductor layer, and a second gate electrode formed on the second gate insulating layer.

21 Claims, 19 Drawing Sheets

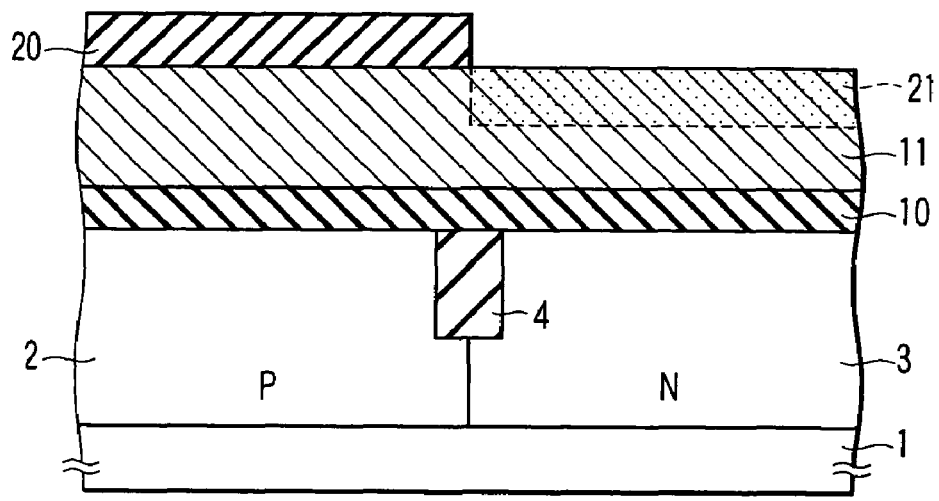
F I G. 22
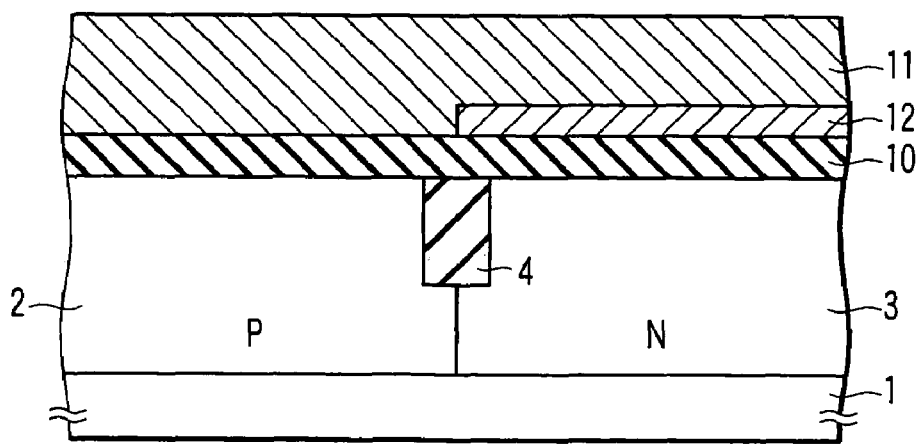
F I G. 23

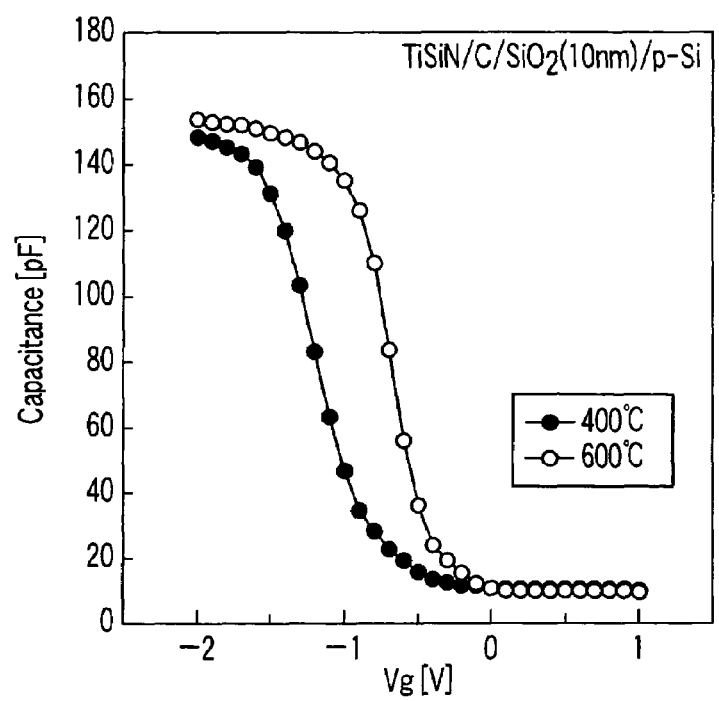
F I G. 24
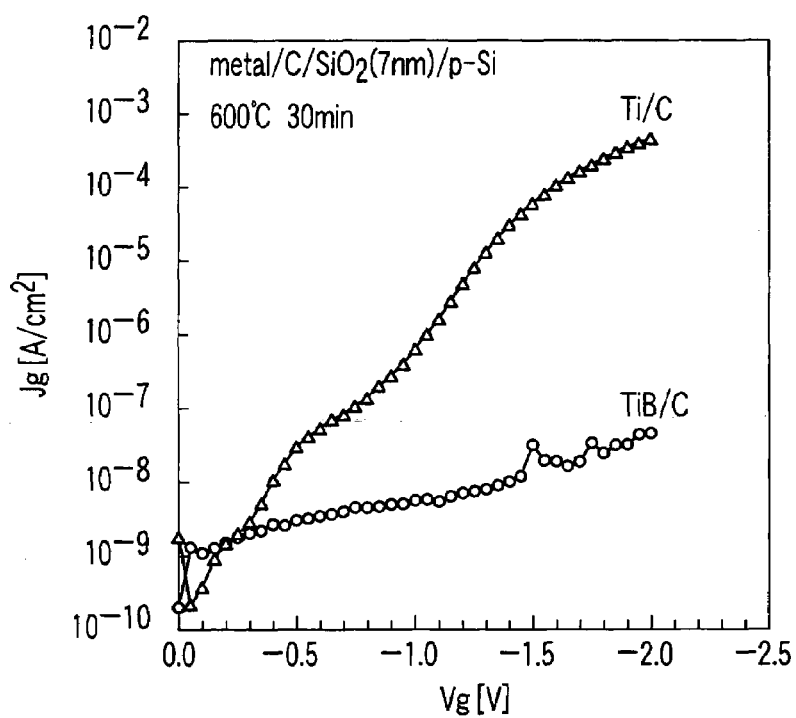
F I G. 25

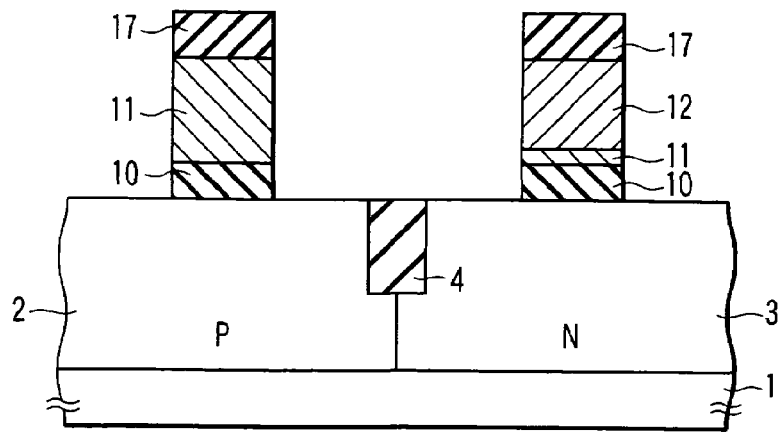
F I G. 2 9
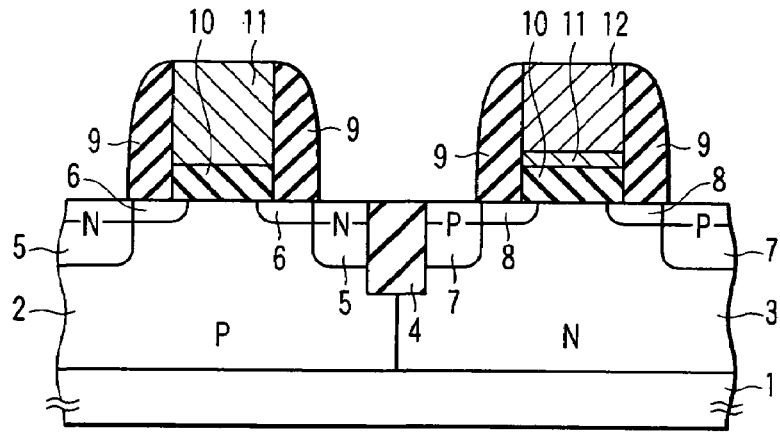
F I G. 3 0
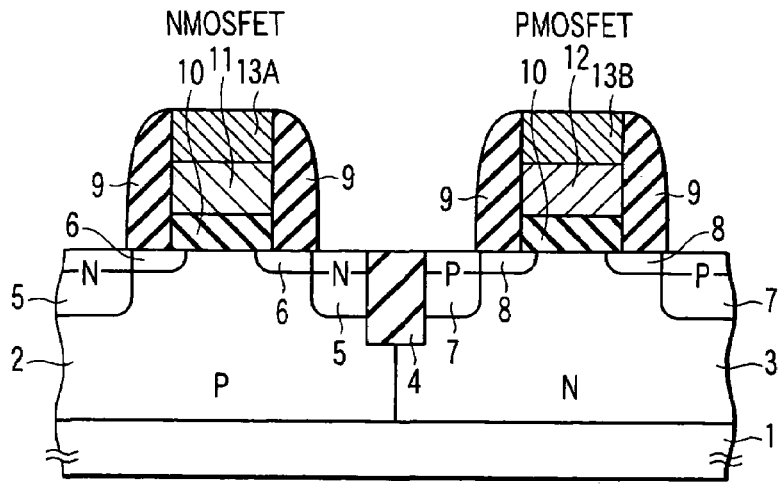
F I G. 3 1

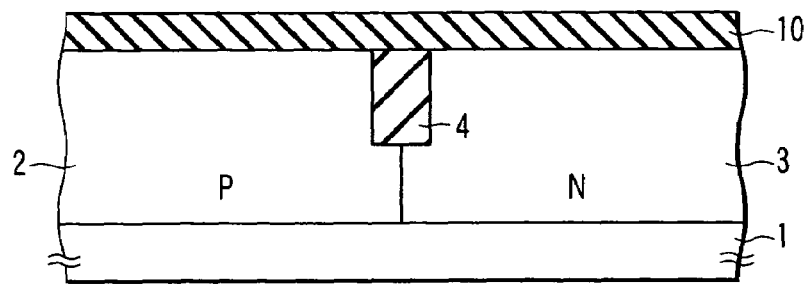
F I G. 3 2
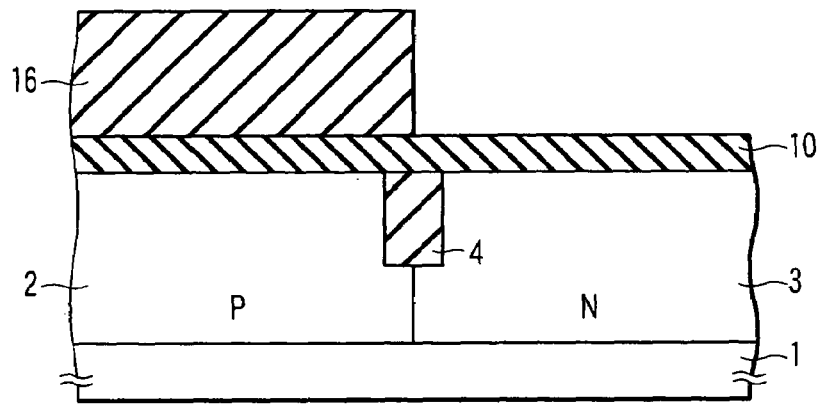
F I G. 3 3
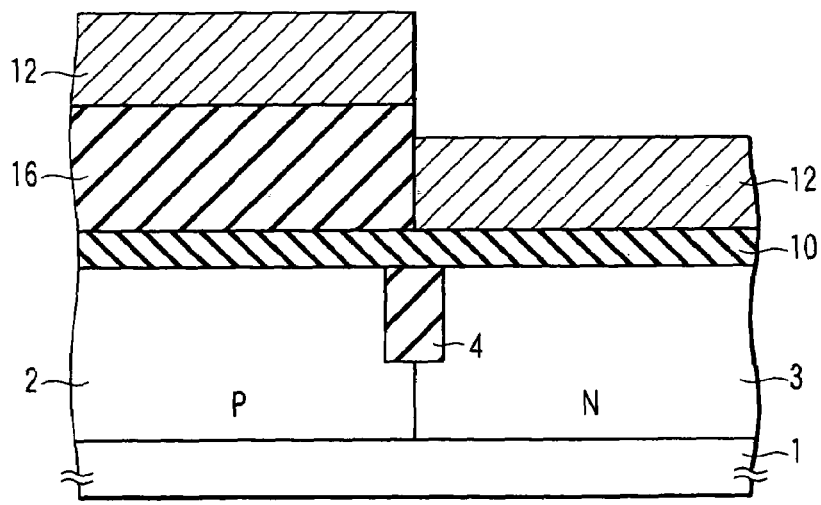
F I G. 3 4

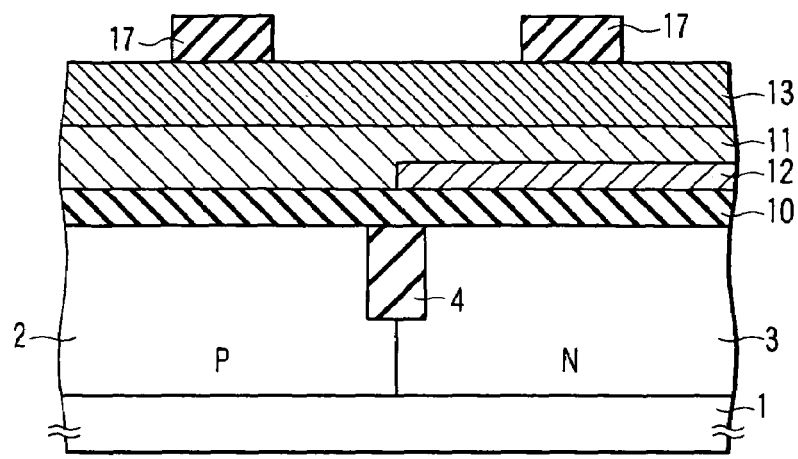
F I G. 4 4
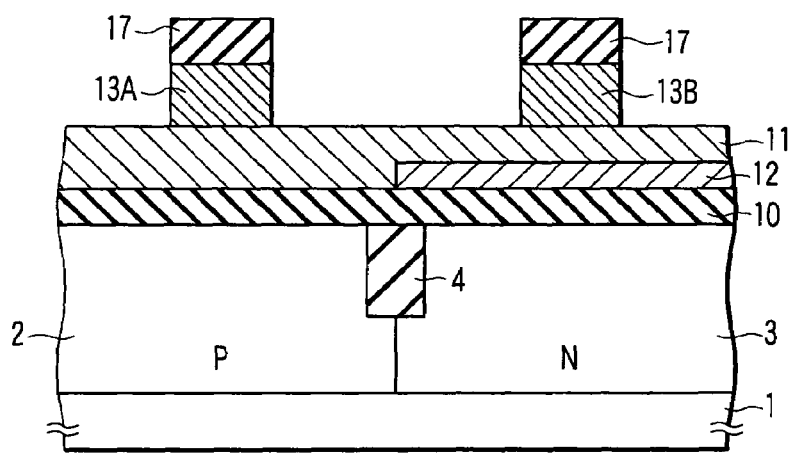
F I G. 4 5
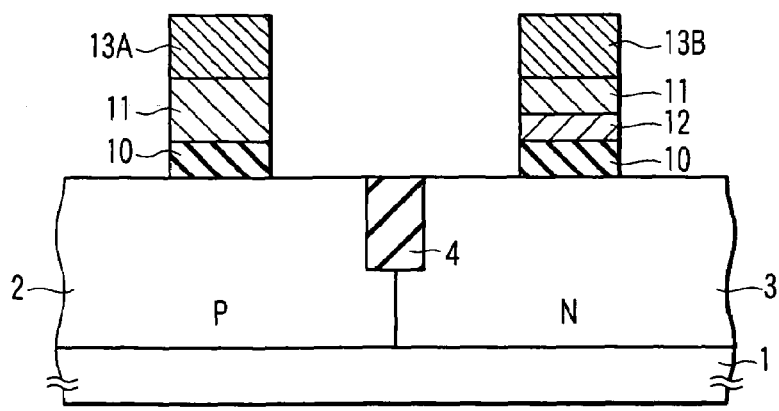
F I G. 4 6

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2005-059396, filed Mar. 3, 2005, the entire contents of which are incorporated herein by reference.

BACKGROUND OF THE INVENTION

1. Field of the Invention

The present invention relates to a semiconductor device and a method for manufacturing the same.

2. Description of the Related Art

In the case of manufacturing a next-generation complementary metal oxide semiconductor (CMOS) device in which a gate length is a submicron size, there is a high possibility that silicon which has been used in previous generations will not be able to be directly used as a gate electrode of a MIS transistor constituting the device.

One of the reasons of the above is that since sheet resistance of the silicon is as high as several tens $\Omega/\square$, a so-called RC delay cannot be ignored any more during a device operation, if the silicon is used for the gate electrode. It is generally considered that in the case of the device in which the gate length is the submicron size, the sheet resistance of the gate electrode which permits the RC delay to be ignored is 5 $\Omega/\square$ or less.

Another of the above-mentioned reasons resides in depletion of the gate electrode. A solution limit of impurities (dopants) with respect to silicon is about $1 \times 10^{20}$ cm$^{-3}$. Therefore, when the gate electrode is made of silicon, a depletion layer of a limited length spreads in the gate electrode to cause deterioration in current driving force of the MIS transistor.

Specifically, as this depletion layer has a capacitance to be serially connected to a gate insulating layer between the gate electrode and a channel, a gate capacitance of the MIS transistor is substantially formed into a shape in which the capacitance of the deletion layer is added to the capacitance of the gate insulating layer. For example, when converted into a thickness of silicon oxide of the gate insulating layer, this added capacitance is about 0.3 nm.

It is likely in the future that a thickness of gate insulating layer of the MIS transistor will become 1.5 nm or less when the silicon oxide is used. Thus, the capacitance of the depletion layer will become 20 percent or more of that of the gate insulating layer, which will not be ignored any more.

As one of means to solve the problem, addition of a high concentration of impurities (phosphorus, boron, or the like) to the silicon gate electrode has been tried to reduce its specific resistance. However, in the case of the MIS transistor having the gate length set to the submicron size, the thickness of the gate insulating layer becomes 1.5 nm or less as described above. In this case, a problem occurs in which the impurities in the gate electrode pass through the gate insulating layer to diffuse to or penetrate a silicon substrate.

Such diffusion or penetration of the impurities causes a fluctuation in drive current or threshold voltage of the MIS transistor.

Recently, therefore, use of a high-melting point metal such as molybdenum, tungsten or tantalum, or a nitride thereof for the gate electrode has been tried. This is called a metal gate technology.

According to the metal gate technology, as the gate electrode is made of a metal whose specific resistance is lower than that of the silicon, an RC delay can basically be ignored. As no depletion layer is formed in the metal in principle, no reduction occurs in current driving force of the MIS transistor by the deletion layer formed in the silicon gate. Additionally, as it is not necessary to add any impurities to the metal gate to reduce its specific resistance, no fluctuation occurs in driving force or threshold voltage of the MIS transistor by diffusion or penetration of impurities.

However, the metal gate technology is not perfect. In the case of manufacturing a CMOS device by this technology, the following unique problems occur.

That is, according to the metal gate technology, a metal material having a work function close to that of P$^+$ silicon must be used for a gate electrode in the case of a P-channel MIS transistor. A metal material having a work function close to that of N$^+$-silicon must be used for a gate electrode in the case of an N-channel MIS transistor. This way, it is possible to set threshold values of the P-channel MIS transistor and the N-channel MIS transistor to proper values.

This is called a dual phi ($\phi$) metal gate. In reality, however, it is difficult to discover a metal material having a work function close to that of the P$^+$ silicon or the N$^+$-silicon and high thermal stability. Thus far, no optimal materials that satisfy such conditions have been found for the gate insulating layer or the gate electrode.

Even if a metal material having high thermal stability and proper work function for the gate insulating layer or the gate electrode is discovered, it is useless unless the metal material can be formed by an LSI manufacturing process. In short, in addition to the structure of the MIS transistor by the dual $\phi$ metal gate technology, a manufacturing method without any increased number of steps and complexity is demanded.

BRIEF SUMMARY OF THE INVENTION

A semiconductor device according to a first aspect of the present invention comprises: a P-channel MIS transistor which includes an N-type semiconductor layer, a first gate insulating layer formed on the N-type semiconductor layer, and a first gate electrode formed on the first gate insulating layer and containing a carbon compound of a metal; and an N-channel MIS transistor which includes a P-type semiconductor layer, a second gate insulating layer formed on the P-type semiconductor layer, and a second gate electrode formed on the second gate insulating layer.

A semiconductor device according to a second aspect of the present invention comprises: a P-channel MIS transistor which includes an N-type semiconductor layer, a first gate insulating layer formed on the N-type semiconductor layer, and a first gate electrode formed on the first gate insulating layer and in which a carbon compound of a metal is present on an interface between the first gate insulating layer and the first gate electrode; and an N-channel MIS transistor which includes a P-type semiconductor layer, a second gate insulating layer formed on the P-type semiconductor layer, and a second gate electrode formed on the second gate insulating layer.

A semiconductor device according to a third aspect of the present invention comprises: a P-channel MIS transistor which includes an N-type semiconductor layer, a first gate insulating layer formed on the N-type semiconductor layer, and a first gate electrode formed on the first gate insulating layer and in which a carbon compound of a metal is present on a portion different from an interface between the first gate insulating layer and the first gate electrode; and an N-channel MIS transistor which includes a P-type semiconductor layer, a second gate insulating layer formed on the P-type semiconductor layer, and a second gate electrode formed on the second gate insulating layer.

A manufacturing method of a semiconductor device according to a first aspect of the present invention comprises: forming gate insulating layers on a P-type semiconductor area and an N-type semiconductor area; forming a first gate material made of a metal, or a boride, silicide or a silicon nitride thereof on the gate insulating layer on the P-type semiconductor area; forming a second gate material made of a carbon compound of the metal on the gate insulating layer on the N-type semiconductor area; simultaneously etching the first and second gate materials to form a first gate electrode from the first gate material and a second gate electrode from the second gate material; and forming an N-type diffusion layer in the P-type semiconductor area and a P-type diffusion layer in the N-type semiconductor area.

A manufacturing method of a semiconductor device according to a second aspect of the present invention comprises: forming gate insulating layers on a P-type semiconductor area and an N-type semiconductor area; forming a carbon layer on the gate insulating layer on the N-type semiconductor area; forming a gate material made of a metal, or a boride, silicide or a silicon nitride thereof on the gate insulating layer and the carbon layer on the N-type semiconductor area; converting the carbon layer into a carbon compound of the metal by heat treatment; etching the gate material and the carbon compound of the metal to form a first gate electrode made of the gate material and a second gate electrode made of the gate material and the carbon compound of the metal; and forming an N-type diffusion layer in the P-type semiconductor area and a P-type diffusion layer in the N-type semiconductor area.

A manufacturing method of a semiconductor device according to a third aspect of the present invention comprises: forming gate insulating layers on a P-type semiconductor area and an N-type semiconductor area; forming a gate material made of a metal, or a boride, silicide or a silicon nitride thereof on the gate insulating layer; implanting carbon ions into the gate material on the N-type semiconductor area; forming a carbon compound of a metal on an interface between the gate insulating layer and the gate material on the N-type semiconductor area by heat treatment; etching the gate material and the carbon compound of the metal to form a first gate electrode made of the gate material and a second gate electrode made of the gate material and the carbon compound of the metal; and forming an N-type diffusion layer in the P-type semiconductor area and a P-type diffusion layer in the N-type semiconductor area.

BRIEF DESCRIPTION OF THE SEVERAL VIEWS OF THE DRAWING

FIG. 22 is a sectional diagram showing a step of the manufacturing method of the device of FIG. 12;

FIG. 23 is a sectional diagram showing a step of the manufacturing method of the device of FIG. 12;

FIG. 24 is a diagram showing a relation between a gate voltage and a capacitance;

FIG. 25 is a diagram showing a relation between a gate voltage and leakage;

FIG. 29 is a sectional diagram showing a step of the manufacturing method of the device of FIG. 26;

FIG. 30 is a sectional diagram showing a step of the manufacturing method of the device of FIG. 26;

FIG. 31 is a sectional diagram showing a CMOS device according to a fourth embodiment;

FIG. 32 is a sectional diagram showing a step of a manufacturing method of the device of FIG. 31;

FIG. 33 is a sectional diagram showing a step of the manufacturing method of the device of FIG. 31;

FIG. 34 is a sectional diagram showing a step of the manufacturing method of the device of FIG. 31;

FIG. 44 is a sectional diagram showing a step of the manufacturing method of the device of FIG. 41;

FIG. 45 is a sectional diagram showing a step of the manufacturing method of the device of FIG. 41;

FIG. 46 is a sectional diagram showing a step of the manufacturing method of the device of FIG. 41;

DETAILED DESCRIPTION OF THE INVENTION

A semiconductor device of an aspect of the present invention will be described below in detail with reference to the accompanying drawings.

1. Overview

An aspect of the present invention relates to a CMOS device, and characterized in that a gate electrode of a P-channel MIS transistor contains a carbon compound of a metal, or there is a carbon compound of a metal on an interface between a gate insulating layer and the gate electrode of the P-channel MIS transistor or a portion different from the interface.

For the metal of the carbon compound, one is selected from a group of Ti, Ta, Zr, Hf, V, Nb, Cr, Mo, W, La, and Y in consideration of heat resistance or the like.

A gate electrode of an N-channel MIS transistor is made of, e.g., one of metals Ti, Ta, Zr, Hf, V, No, Cr, Mo, W, La and Y, or a boride, a silicide or silicon nitride of such a metal.

From the viewpoint of processing, a main portion of the gate electrode of the P-channel MIS transistor may be made of the same material as that of the gate electrode of the N-channel MIS transistor, e.g., one of the metals Ti, Ta, Zr, Hf, V, Nb, Cr, Mo, W, La, and Y, or the boride, the silicide or the silicon nitride of such a metal.

In view of corrosion resistance, oxidation resistance or the like, the gate electrodes of the P and N-channel MIS transistors may both employ laminated structures, and an uppermost layer of each thereof may be made of one of Si and SiGe.

By employing such a structure, it is possible to provide a CMOS device having low resistance and thermal stability, and a gate electrode in which problems of depletion and diffusion or penetration of impurities will never occur.

There is available a technology which uses a carbon compound of tantalum (TaxCy) for a gate electrode (see Nonpatent Document 1).

Figure 1:
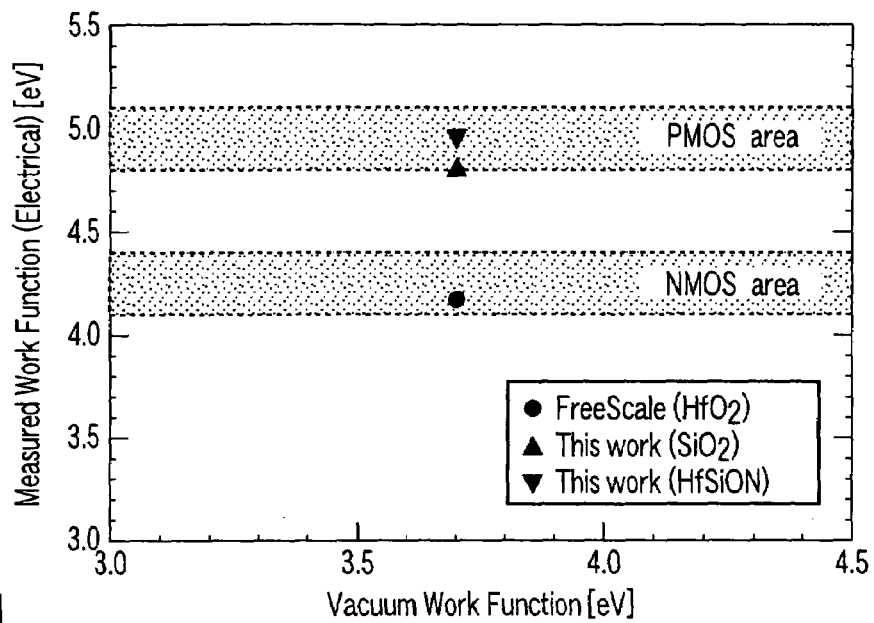
FIG. 1 is a diagram showing a relation between a material of a gate insulating layer and a work function.

According to this technology, a vacuum work function electrically becomes 4.18 eV when TaxCy of 3.7 eV is formed on $HfO_2$. As shown in FIG. 1, this value is suitable for the gate electrode of the N-channel MIS transistor of the CMOS device. The Nonpatent Document 1 shows actual studies on characteristics of the N-channel MIS transistor which uses TaxCy for the gate electrode.

On the other hand, the aspect of the present invention focuses on the gate electrode of the P-channel MIS transistor. This is because the aforementioned conventional problems mainly affect the P-channel MIS transistor greatly. In other words, a switching speed is faster in the P-channel MIS transistor having carriers as holes than in the N-channel MIS transistor having carriers as electrons, and diffusion or penetration of impurities causes a greater fluctuation in driving force or threshold voltage.

Thus, according to the aspect of the present invention, the process starts from discovery of a combination of the gate electrode and the gate insulating layer to obtain a work function of the gate electrode suitable for the P-channel MIS transistor. Accordingly, the aspect of the present invention is completely different from a technical idea disclosed in the Nonpatent Document 1.

According to the aspect of the present invention, for example, a tantalum carbon compound (TaxCy) is used for the gate electrode of the P-channel MIS transistor. The vacuum work function of TaxCy is 3.7 eV as described above. As shown in FIG. 1, however, when HfSiON is used for the gate insulating layer, the work function of TaxCy becomes 4.94 eV. When $SiO_2$ is used for the gate insulating layer, the work function of TaxCy becomes 4.78 eV.

This value is suitable for the gate electrode of the P-channel MIS transistor. Thus, the aspect of the present invention provides a P-channel MIS transistor which has high thermal stability but no fluctuation in driving force or threshold voltage and can carry out high-speed switching.

Table 1 shows an aspect of a material combination of the gate electrode and the gate insulating layer to obtain a work function suitable for the gate electrode of the P-channel MIS transistor.

TABLE 1

| Work function of gate electrode | | |
|---|---|---|
| Gate electrode material | Gate insulating film material | |
| | $SiO_2$ | HfSiON |
| Ti carbide | 4.74 eV | 5.00 eV |
| Ta carbide | 4.78 eV | 4.94 eV |
| W carbide | 4.88 eV | 4.96 eV |

Generally, the work function of the gate electrode when HfSiON is used for the gate insulating layer becomes higher by 0.2 to 0.3 eV than that of the gate electrode when $SiO_2$ is used for the gate insulating layer.

In the case of using TaxCy for the gate electrode of the P-channel MIS transistor, the TaxCy is set in a crystal state. When the TaxCy is (111) oriented, it is possible to obtain a threshold voltage most suitable for the P-channel MIS transistor.

This is because an atomic surface density of a (111) surface of the TaxCy is high. The work function which is energy of pulling out electrons from a solid object is generally higher in the case of a material of a higher atomic surface density.

2. EMBODIMENTS

Next, some preferred embodiments will be described.

(1) First Embodiment

A first embodiment is directed to a CMOS device in which materials of N and P-channel MIS transistors are different from each other.

A. Structure

Figure 2:
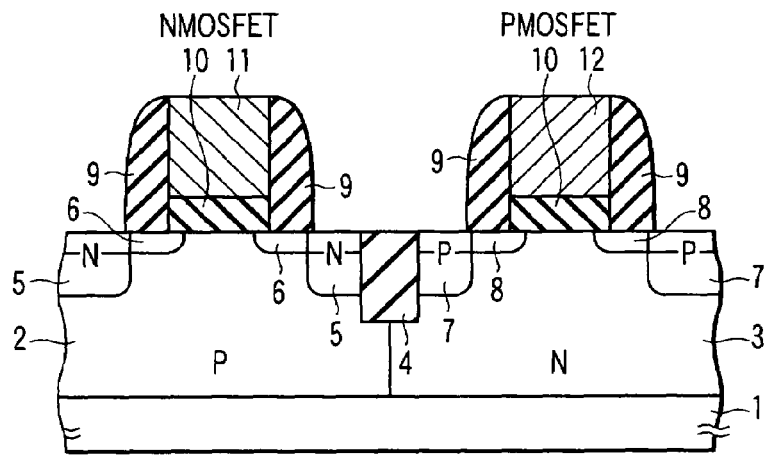
FIG. 2 is a sectional diagram showing a CMOS device according to a first embodiment.

FIG. 2 shows a sectional structure of the CMOS device according to the first embodiment of the present invention.

In a semiconductor substrate 1, a P-type well area 2 and an N-type well area 3 are arranged. The P-type and N-type well areas 2 and 3 are isolated from each other by an device isolation layer 4 of a shallow trench isolation (STI) structure.

The N-channel MIS transistor is arranged in the P-type well area 2.

The N-channel MIS transistor comprises an N-type diffusion layer 5, an N-type extension layer 6, a gate insulating layer 10, and a gate electrode 11. A side wall insulating layer 9 is formed on a side wall of the gate electrode 11.

As shown in FIG. 1, for example, the gate electrode 11 of the N-channel MIS transistor is made of a material which has a work function in a range of 4.10 eV to 4.40 eV. Here, such a material will be referred to as a low work function material. For the low work function material, a metal selected from the group consisting of Ti, Ta, Zr, Hf, V, Nb, Cr, Mo, W, La, and Y, or a boride, a silicide or a silicon nitride of such a metal is available.

From the standpoint of thermal stability and chemical stability for an LSI process, for the gate electrode of the N-channel MIS transistor, a boride or a silicon nitride of a metal selected from the group consisting of Ti, Ta, Zr, Hf, V, Nb, Cr, Mo, W, La, and Y is most preferably used.

The P-channel MIS transistor is arranged in the N-type well area 3.

The P-channel MIS transistor comprises a P-type diffusion layer 7, a P-type extension layer 8, a gate insulating layer 10, and a gate electrode 12. A side wall insulating layer 9 is formed on a side wall of the gate electrode 12.

As shown in FIG. 1, for example, the gate electrode 12 of the P-channel MIS transistor is made of a material which has a work function in a range of 4.80 eV to 5.10 eV. Here, such a material will be referred to as a high work function material. For the high work function material, when an insulating material such as $SiO_2$ or HfSiON is used for the gate insulating layer 10, a carbon compound of a metal selected from the group consisting of Ti, Ta, Zr, Hf, V, Nb, Cr, Mo, W, La, and Y, is used.

Such a carbon compound of a metal has a melting point of above 2000° C., and is chemically inactive. Thus, from the standpoint of thermal stability and chemical stability for an LSI process, it is very excellent.

As described above, according to the first embodiment, the gate electrode of the N-channel MIS transistor is made of the low work function material, and the gate electrode of the P-channel MIS transistor is made of the carbon compound of a metal having the high work function. Thus, it is possible to provide a CMOS device having low resistance and high thermal stability, and a gate electrode in which problems of depletion or diffusion/penetration of impurities never occur.

B. Manufacturing Method

Next, a manufacturing method of the CMOS device of FIG. 2 will be described by way of example in which a carbon compound (TaxCy) of tantalum (Ta) is used for the gate electrode of the P-channel MIS transistor.

Figure 3:
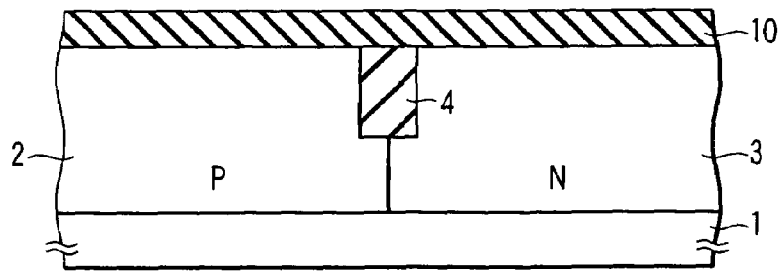
FIG. 3 is a sectional diagram showing a step of a manufacturing method of the device of FIG. 2.

First, as shown in FIG. 3, through a normal LSI process, a P-type well area 2, an N-type well area 3, and an device isolation layer 4 are formed in a semiconductor substrate 1. Subsequently, for example, a gate insulating layer 10 is formed by a MOCVD method.

For the gate insulating layer 10, a high dielectric of one selected from the group consisting of $SiO_2$, SiON, $TiO_2$, $HfO_2$, $Ta_2O_5$, $ZrO_2$, HfSiO, ZrSiO, HfSiON, ZrSiON, HfON, ZrON, $La_2O_3$, LaSiO, LaAlO, LaHfO, and TiAlO can be used.

Figure 4:
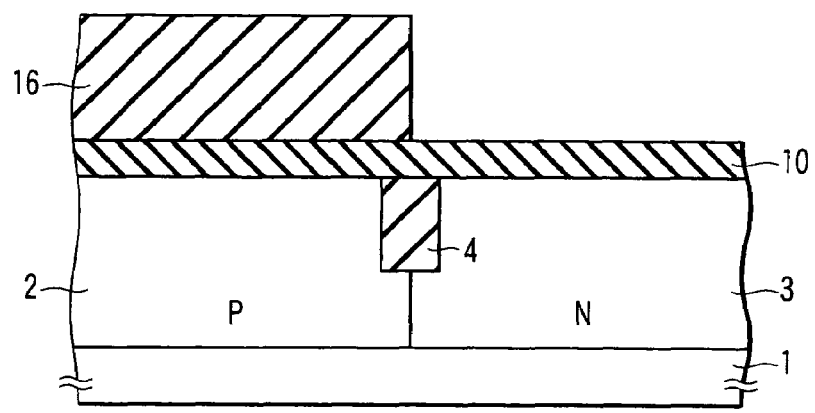
FIG. 4 is a sectional diagram showing a step of the manufacturing method of the device of FIG. 2.

Next, as shown in FIG. 4, for example, a silicon nitride is formed with a thickness of about 300 nm on the gate insulating layer 10 by a LPCVD method. Subsequently, this silicon nitride is patterned by a photoengraving process (PEP) to form a mask material 16 made of silicon nitride on the P-type well area 2.

Figure 5:
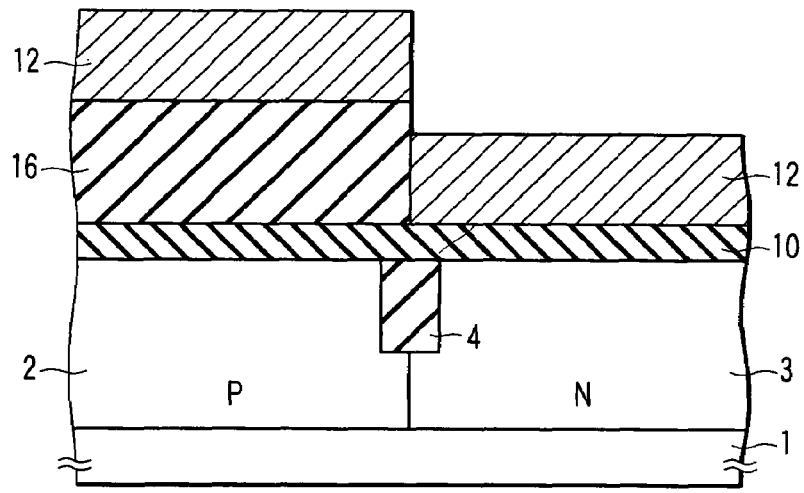
FIG. 5 is a sectional diagram showing a step of the manufacturing method of the device of FIG. 2.

Next, as shown in FIG. 5, a carbon compound of a metal (metal carbide hereinafter) 12, TaxCy according to the embodiment, is formed with a thickness of about 100 nm on the gate insulating layer 10 and the mask material 16.

The metal carbide 12 can be formed by using a deposition method such as a sputtering method or a CVD method. According to the embodiment, however, a peeling-off method based on a lift-off method is employed for the metal carbide 12 on the mask material 16 as described later. Thus, it is preferable to form the metal carbide 12 by the sputtering method in which coverage in a step portion is low.

From the standpoint of preventing damage of the gate insulating layer 10, it is possible to employ a sputtering method (long throw sputtering method) which uses a long throw sputtering device having a distance sufficiently enlarged between a target as a material source and the semiconductor substrate.

There is no particular limitation on deposition conditions such as gas pressure, a gas flow rate, and plasma power. Deposition conditions may be decided by using general deposition parameters.

Regarding a composition of TaxCy of the metal carbide 12, when the sputtering method is employed, a material having a stoicheiometric composition of Tac (x=1, y1) or a material close to this is used, whereby a chemically stable gate electrode can be provided.

In this case, even when the composition of the TaxCy of the metal carbide 12 fluctuates, there will be almost no great influence on chemical stability or a value of a work function as long as a fluctuation width is about 10%.

Figure 6:
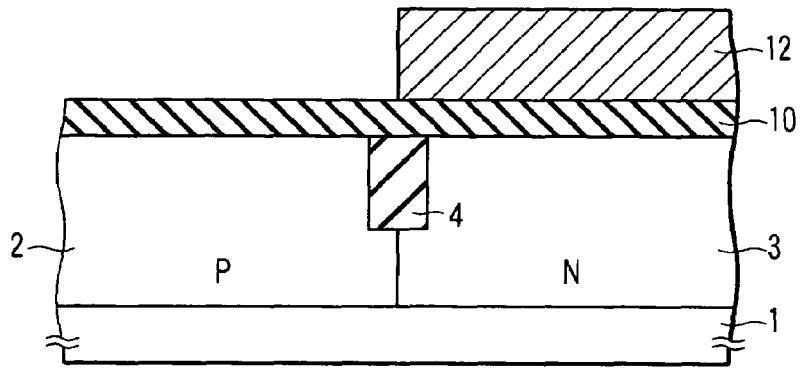
FIG. 6 is a sectional diagram showing a step of the manufacturing method of the device of FIG. 2.

Next, as shown in FIG. 6, by the lift-off method, the metal carbide 12 on the mask material 16 is peeled off together with the mask material 16 shown in FIG. 5. For example, by using a thermal sulfuric acid to peel off the mask material 16 made of the silicon nitride, the metal carbide 12 thereon can be simultaneously peeled off. In this case, the metal carbide on the N-type well area 3 will not be peeled off as it is in a chemically stable state.

Figure 7:
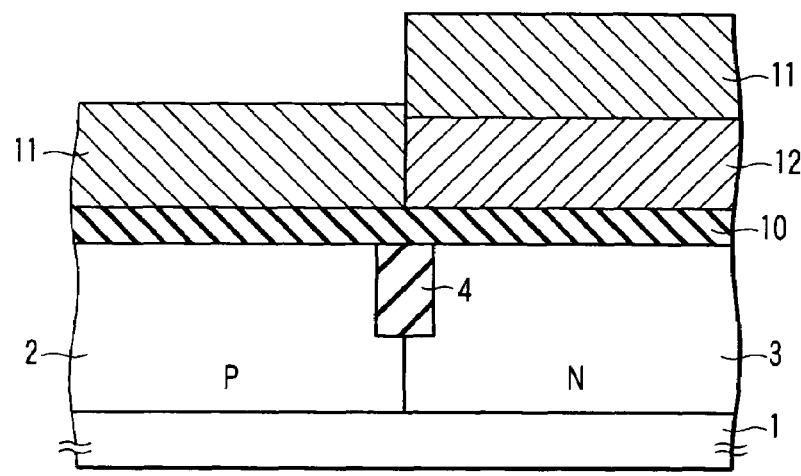
FIG. 7 is a sectional diagram showing a step of the manufacturing method of the device of FIG. 2.

Next, as shown in FIG. 7, a silicon nitride 11 of a metal having a low work function, TaSiN according to the embodiment, is formed with a thickness of about 120 nm on the gate insulating layer 10 and the metal carbide 12.

In this case, the silicon nitride 11 of a metal can be formed by using the deposition method such as the sputtering method or the CVD method. According to the embodiment, however, to prevent damage of the gate insulating layer 10, the CVD method or the long slow sputtering method is preferably used.

Figure 8:
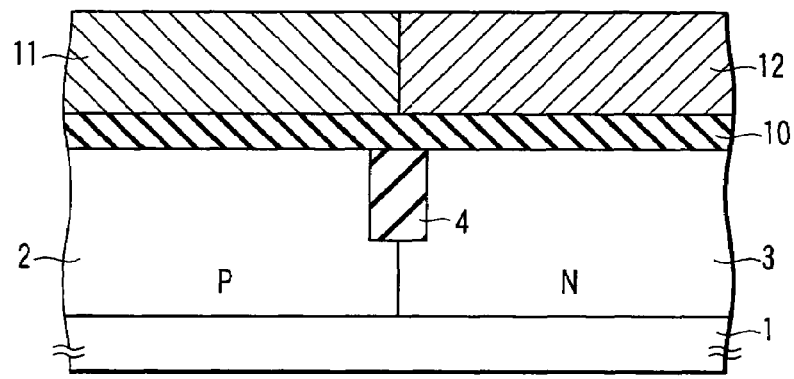
FIG. 8 is a sectional diagram showing a step of the manufacturing method of the device of FIG. 2.

Next, as shown in FIG. 8, the silicon nitride 11 of a metal is polished by using a planarizing method such as a chemical mechanical polishing (CMP) method to remove the silicon nitride 11 of a metal from above the N-type well area 3.

Figure 9:
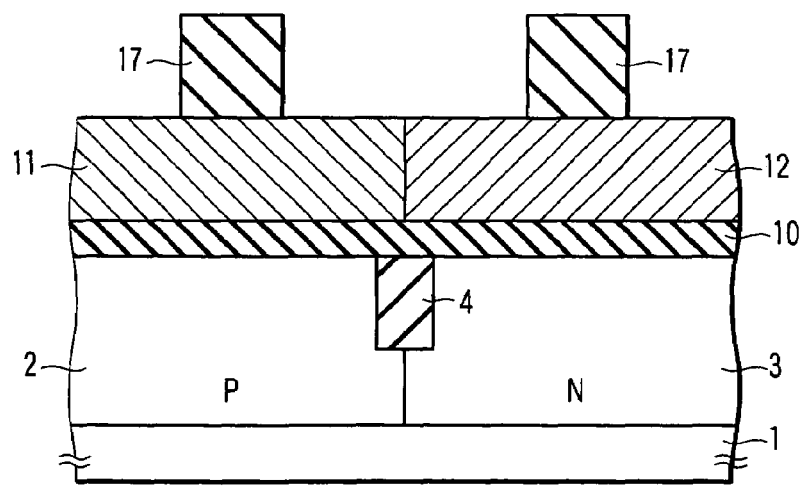
FIG. 9 is a sectional diagram showing a step of the manufacturing method of the device of FIG. 2.

Next, as shown in FIG. 9, a photoresist 17 is formed by PEP to process the gate electrode. By using this photoresist 17 as a mask, the silicon nitride 11 of a metal, the metal carbide 12, and the gate insulating layer 10 are etched. Subsequently, the photoresist 17 is removed.

Figure 10:
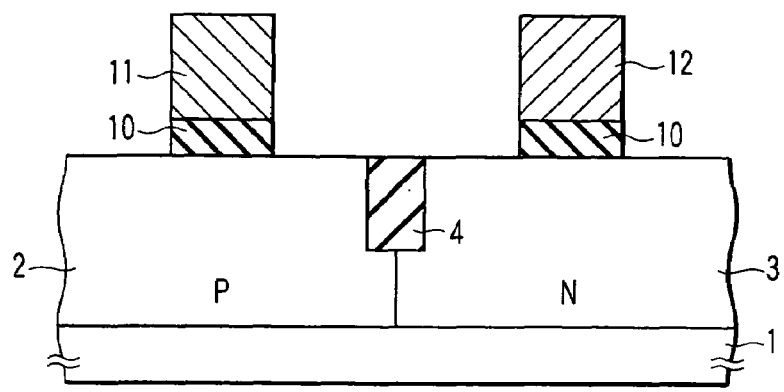
FIG. 10 is a sectional diagram showing a step of the manufacturing method of the device of FIG. 2.

As a result, as shown in FIG. 10, the gate insulating layer 10 and the gate electrode 11 of a low work function are formed on the P well area 2, and the gate insulating layer 10 and the gate electrode 12 made of the metal carbide (TaxCy) are formed on the N well area 3.

According to the embodiment, the gate electrode 11 of the N-channel MIS transistor is made of TaSiN, and the gate electrode 12 of the P-channel MIS transistor is made of TaxCy.

Thus, by using the same kind of metals for both of the gate electrodes 11 and 12, Ta according to the embodiment, selection of a reactive gas for simultaneously processing both electrodes is facilitated.

Figure 11:
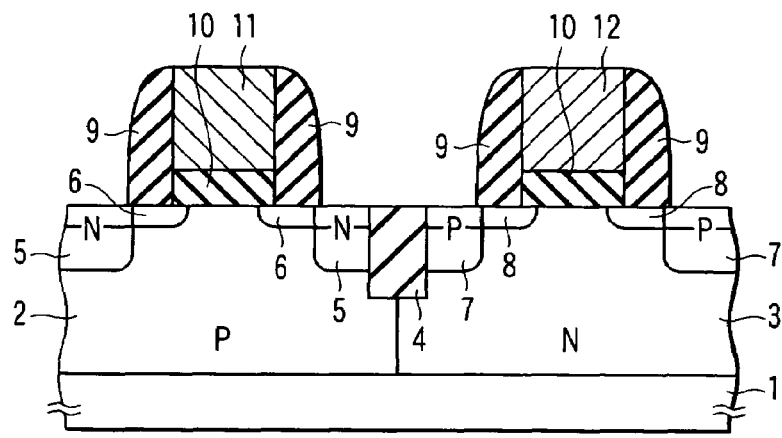
FIG. 11 is a sectional diagram showing a step of the manufacturing method of the device of FIG. 2.

Lastly, as shown in FIG. 11, through the normal LSI process, side wall insulating layers 9 are formed on side walls of the gate electrodes 11 and 12, an N-type diffusion layer 5 and an N-type extension layer 6 are formed in the P well area 2, and a P-type diffusion layer 7 and a P-type extension layer 8 are formed in the N well area 3.

Through the aforementioned process, the CMOS device of FIG. 2 is completed.

(2) Second Embodiment

A second embodiment is directed to a CMOS device in which a main portion of a gate electrode of a P-channel MIS transistor is made of a material similar to that of a gate electrode of an N-channel MIS transistor.

A. Structure

Figure 12:
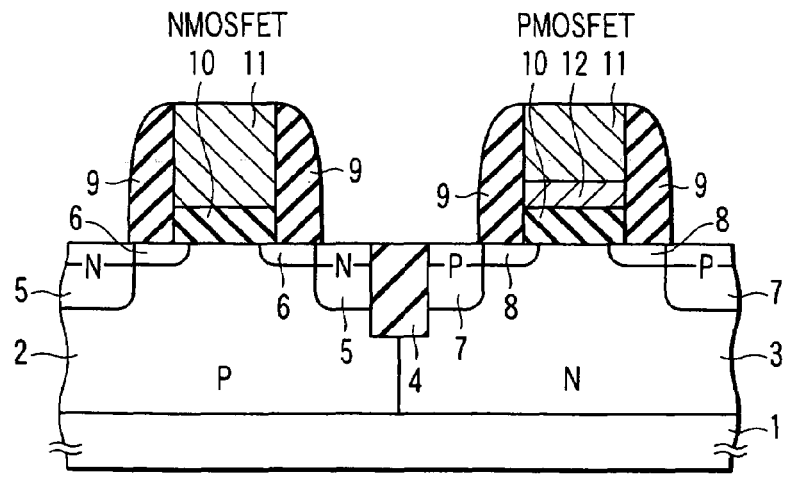
FIG. 12 is a sectional diagram showing a CMOS device according to a second embodiment.

FIG. 12 shows a sectional structure of the CMOS device according to the second embodiment of the present invention.

In a semiconductor substrate 1, a P-type well area 2 and an N-type well area 3 are arranged. The P-type and N-type well areas 2 and 3 are isolated from each other by an device isolation layer 4 of a STI structure.

The N-channel MIS transistor is arranged in the P-type well area 2.

The N-channel MIS transistor comprises an N-type diffusion layer 5, an N-type extension layer 6, a gate insulating layer 10, and a gate electrode 11. A side wall insulating layer 9 is formed on a side wall of the gate electrode 11.

As in the case of the first embodiment, for example, the gate electrode 11 of the N-channel MIS transistor is made of a low work function material which has a work function in a range of 4.10 eV to 4.40 eV. For the low work function material, a metal selected from the group consisting of Ti, Ta, Zr, Hf, V, Nb, Cr, Mo, W, La, and Y, or a boride, a silicide or a silicon nitride of such a metal is available.

From the standpoint of thermal stability and chemical stability for an LSI process, for the gate electrode of the N-channel MIS transistor, a boride or a silicon nitride of a metal selected from the group consisting of Ti, Ta, Zr, Hf, V, Nb, Cr, Mo, W, La, and Y is most preferably used.

The P-channel MIS transistor is arranged in the N-type well area 3.

The P-channel MIS transistor comprises a P-type diffusion layer 7, a P-type extension layer 8, a gate insulating layer 10, and gate electrodes 11, 12. Side wall insulating layers 9 are formed on side walls of the gate electrodes 11, 12.

The gate electrodes 11, 12 of the P-channel MIS transistor have laminated structures. The gate electrode 11 is made of a low work function material similar to that of the gate electrode 11 of the N-channel MIS transistor. The gate electrode 12 is arranged between the gate insulating layer 10 and the gate electrode 11, and made of a high work function material which has a work function, e.g., in a range of 4.80 eV to 5.10 eV.

For the high work function material, when an insulating material such as $SiO_2$ or HfSiON is used for the gate insulating layer 10, a carbon compound of a metal selected from the group consisting of Ti, Ta, Zr, Hf, V, Nb, Cr, Mo, W, La, and Y, is used.

Such a carbon compound of a metal has a melting point of above 2000° C., and is chemically inactive. Thus, from the standpoint of thermal stability and chemical stability for an LSI process, it is very excellent.

When the gate electrode 12 of the P-channel MIS transistor is made of the same metal as that of the gate electrode 11, e.g., Ta, the gate electrode 12 may employ a structure in which it is a part of the gate electrode 11, e.g., TaSiN, and carbon atoms (C) are contained in a part thereof.

As described above, according to the second embodiment, the gate electrode of the P-channel MIS transistor contains the carbon compound of a metal having a high work function. Thus, it is possible to provide a CMOS device having low resistance and high thermal stability, and a gate electrode in which problems of depletion or diffusion/penetration of impurities never occur.

Furthermore, according to the second embodiment, the main portion of the gate electrode of the P-channel MIS transistor, i.e., the gate electrode 11, is made of the same material as that of the gate electrode 11 of the N-channel MIS transistor. Thus, great advantages can be provided in easy designing and easy processing of heat costs for guaranteeing heat resistance.

B. Manufacturing Method

FIRST EXAMPLE

Next, a first example of a manufacturing method of the CMOS device of FIG. 12 will be described by way of example in which a carbon compound (TaxCy) of tantalum (Ta) is used for the gate electrode of the P-channel MIS transistor.

Figure 13:
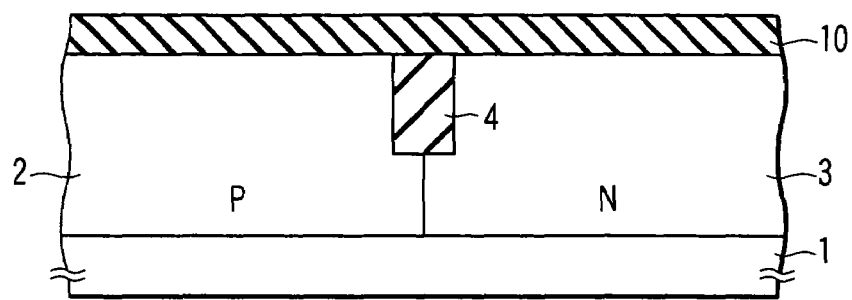
FIG. 13 is a sectional diagram showing a step of a manufacturing method of the device of FIG. 12.

First, as shown in FIG. 13, through a normal LSI process, a P-type well area 2, an N-type well area 3, and an element isolation layer 4 are formed in a semiconductor substrate 1. Subsequently, for example, a gate insulating layer 10 is formed by a MOCVD method.

For the gate insulating layer 10, a high dielectric of one selected from the group consisting of $SiO_2$, SiON, $TiO_2$, $HfO_2$, $Ta_2O_5$, $ZrO_2$, HfSiO, ZrSiO, HfSiON, ZrSiON, HfON, ZrON, $La_2O_3$, LaSiO, LaAlO, LaHfO, and TiAlO can be used.

Figure 14:
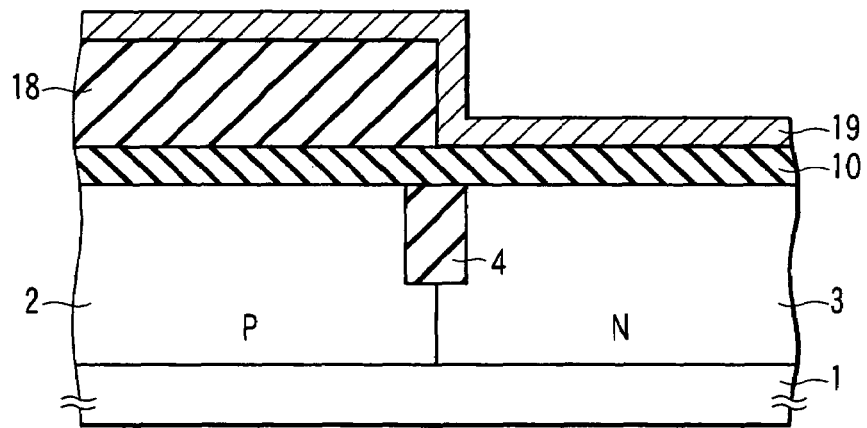
FIG. 14 is a sectional diagram showing a step of the manufacturing method of the device of FIG. 12.

Next, as shown in FIG. 14, for example, a silicon oxide is formed with a thickness of about 5 nm on the gate insulating layer 10 by a LPCVD method. Subsequently, this silicon oxide is patterned by a photoengraving process (PEP) to form a mask material 18 made of silicon oxide on the P-type well area 2.

A carbon layer 19 is formed on the gate insulating layer 10 and the mask material 18 by using a deposition method such as a sputtering method or a CVD method.

In this case, preferably, a thickness of the carbon layer 19 is set to a value in range of 2 nm or more to 5 nm or less. To secure continuity of carbon atoms of the carbon layer 19, its thickness must be set to 2 nm or more. When the thickness of the carbon layer 19 exceeds 5 nm, distortion at the time of reacting the carbon layer 19 with the metal to form a metal carbide facilitates peeling-off of the gate electrode from the gate insulating layer.

When the carbon layer 19 is less than 2 nm, a variance occurs in a value of a work function of the gate electrode after the carbon layer 19 is reacted with the metal to form the metal carbide, creating a possibility that the value will become unsuitable for the P-channel MIS transistor.

The carbon layer 19 is peeled off by a lift-off method as described later. Thus, it is preferably formed by a sputtering method having low coverage in a step portion.

To prevent damage of the gate insulating layer, a so-called long throw sputtering method having a distance sufficiently expanded between a target as a material source and the semiconductor substrate can be employed.

There is no particular limitation on deposition conditions such as gas pressure, a gas flow rate, and plasma power. The deposition conditions may be decided by using general deposition parameters.

Figure 15:
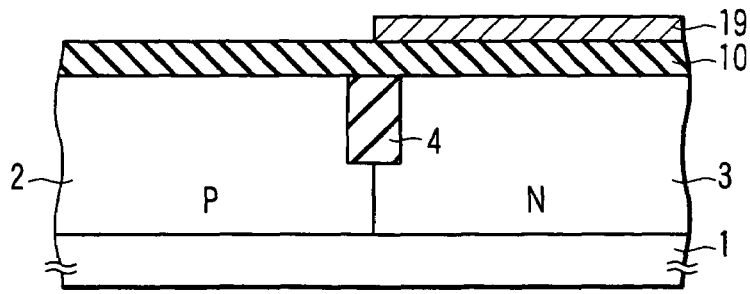
FIG. 15 is a sectional diagram showing a step of the manufacturing method of the device of FIG. 12.

Next, as shown in FIG. 15, the carbon layer 19 on the mask material 18 is peeled off together with the mask material 18 shown in FIG. 14 by the lift-off method. For example, when the mask material 18 made of the silicon oxide is peeled off by using a dilute HF aqueous solution, the carbon layer 19 thereon is simultaneously peeled off. In this case, the carbon layer 19 present above the N well area 3 is never peeled off.

Figure 16:
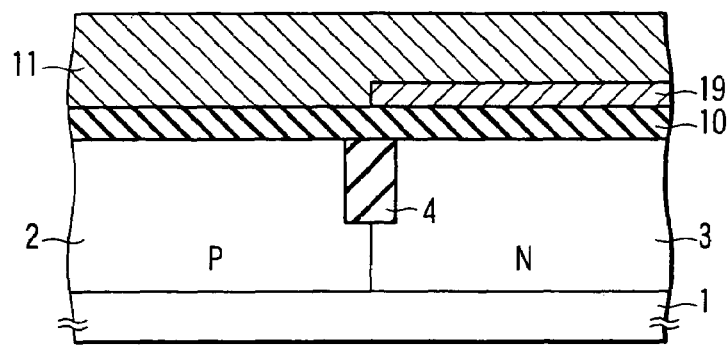
FIG. 16 is a sectional diagram showing a step of the manufacturing method of the device of FIG. 12.

Next, as shown in FIG. 16, a silicon nitride 11 of a metal having a low work function, TaSiN according to the embodiment, is formed with a thickness of about 100 nm on the gate insulating layer 10 and the carbon layer 19.

The silicon nitride 11 of a metal can be formed by using a deposition method such as a sputtering method or a CVD method. According to the embodiment, to prevent damage of the gate insulating layer 10, the CVD method or the long throw sputtering method is preferably used.

Figure 17:
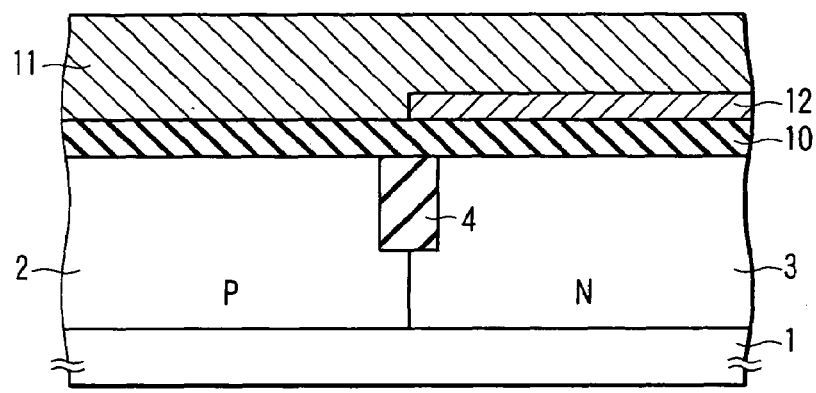
FIG. 17 is a sectional diagram showing a step of the manufacturing method of the device of FIG. 12.

Next, as shown in FIG. 17, when heat treatment is carried out, the carbon layer 19 of FIG. 16 chemically reacts with the metal in the silicon nitride of a metal (TaSiN) 11, Ta according to the embodiment, to change into a carbon compound of a metal (metal carbide hereinafter) 12, i.e., TaxCy.

To sufficiently change the carbon layer 19 of FIG. 16 into the metal carbide 12, a temperature of the heat treatment is set to a value in a range of 500° C. or more to 1100° C. or less. To sufficiently progress the reaction between the carbon and the metal, a temperature of 500° C. or more is necessary. When a temperature of the heat treatment exceeds 1000° C., characteristics deteriorate.

Now, a relation between the temperature of the heat treatment and characteristics of the metal carbide 12 formed by the heat treatment will be described.

FIG. 24 shows a capacitance (C)-gate voltage (Vg) curve of a MIS capacitor which includes a gate electrode containing the metal carbide 12.

A structure before the heat treatment comprises a silicon nitride of a metal (TiSiN), a carbon layer (C), a gate insulating layer ($SiO_2$), and a P-type well area (p-Si).

When heat treatment is carried out at a temperature of 400° C. for 30 minutes, a work function of a gate electrode formed after the heat treatment becomes 4.1 eV. This exhibits physical property value of TiSiN. If reaction between TiSiN and carbon (C) does not progress at all, a work function of the carbon is exhibited. It can therefore be concluded that the carbon is captured into TiSiN by heat treatment of a temperature 400° C., and TiSiN has a predominant influence on the work function of the gate electrode.

On the other hand, when heat treatment is carried out at a temperature of 600° C. for 30 minutes, a flat band voltage is shifted by 0.7V to a positive voltage side, and a work function of a gate electrode formed after the heat treatment becomes about 4.8 eV. This is very close to a work function of TiC. It can be concluded that by the heat treatment of the temperature 600° C., reaction between TiSiN and carbon (C) sufficiently progresses, and the carbon layer is almost completely changed into a metal carbon layer.

In heat treatment at a temperature exceeding 1100° C., a behavior of TiC formed by thermal reaction to further react with the gate insulating layer ($SiO_2$) emerges, consequently causing large current leakage (gate leakage).

According to the embodiment, from the standpoint of reducing current leakage, as a low work function material to react with the carbon layer, a boride, a silicide, or a silicon nitride of a metal is more preferable than a single metal.

FIG. 25 shows gate leak (Jg)-gate voltage (Vg) characteristics of the MIS transistor when Ti and TiB are used as low work function materials.

Heat treatment conditions are a temperature 600° C. and time 30 minutes.

As apparent from the drawing, current leakage is very large in the case of using Ti as the low work function material, while current leakage is greatly reduced in the case of using TiB as compared with the case of using Ti.

Such a trend similarly appears when TiSiN and TiSi are used as low work function materials with respect to Ti. The same applies when a boride, a silicide or a silicon nitride thereof is used with respect to Ta, Zr, Hf, V, Nb, Cr, Mo, W, La, or Y.

The occurrence of such large current leakage can be attributed to the fact that when a single metal is used as a low work function material, reaction with the carbon layer progresses very rapidly, and active metal atoms generated in the middle of the reaction reduce the gate insulating layer, causing electric short-circuiting between the gate electrode and a source/drain.

On the other hand, when a boride, a silicide or a silicon nitride of a metal is used as a low work function material, reaction with the carbon layer slowly progresses to suppress generation of active metal atoms.

Description will return to the manufacturing method.

Figure 18:
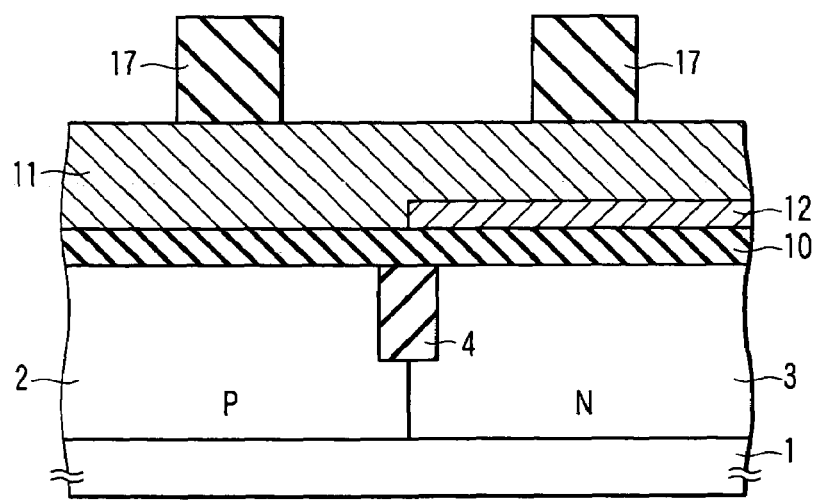
FIG. 18 is a sectional diagram showing a step of the manufacturing method of the device of FIG. 12.

Subsequently, as shown in FIG. 18, a photoresist 17 is formed by PEP to process the gate electrode. By using this photoresist 17 as a mask, the silicon nitride 11 of a metal, the metal carbide 12, and the gate insulating layer 10 are etched. Subsequently, the photoresist 17 is removed.

Figure 19:
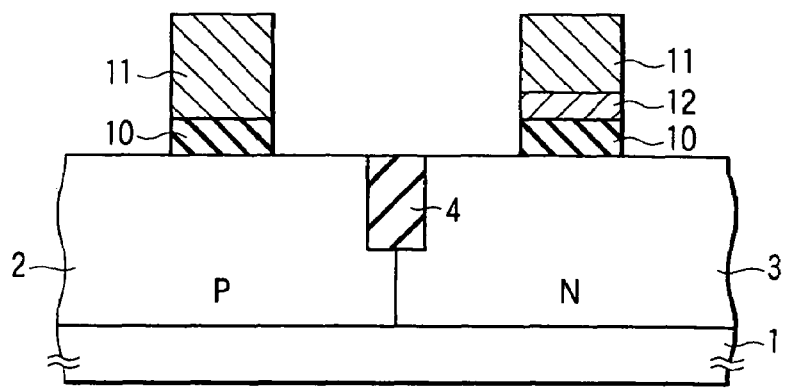
FIG. 19 is a sectional diagram showing a step of the manufacturing method of the device of FIG. 12.

As a result, as shown in FIG. 19, the gate insulating layer 10 and the gate electrode 11 made of the silicon nitride of a metal are formed on the P well area 2, and the gate insulating layer 10 and the gate electrodes 11, 12 constituted of stacked layers of the metal carbide (TaxCy) and the silicon nitride of a metal are formed on the N well area 3.

According to the embodiment, for example, the gate electrode 11 of the N-channel MIS transistor is made of TaSiN, and the gate electrodes 11, 12 of the P-channel MIS transistor are constituted of stacked layers of TaSiN and TaxCy in this case.

Thus, by using the same kind of materials for main portions (uppermost layers) of all of the gate electrode 11 of the N-channel MIS transistor and the gate electrodes 11 and 12 of the P-channel MIS transistor, TaSiN according to the embodiment, for example, both electrodes can be simultaneously etched by reactive ion etching (RIE).

When a thickness of the gate electrode (TaSiN) 11 of the P-channel MIS transistor is about 100 nm, to realize simultaneous processing of both gate electrodes, a thickness of the gate electrode (TaxCy) 12 of the P-channel MIS transistor is preferably set to a value in a range of 4 nm to 10 nm. By providing a thickness of 4 nm or more, a work function value suited to the P-channel MIS transistor of TaxCy can be effectively used to facilitate setting of a threshold voltage.

Figure 20:
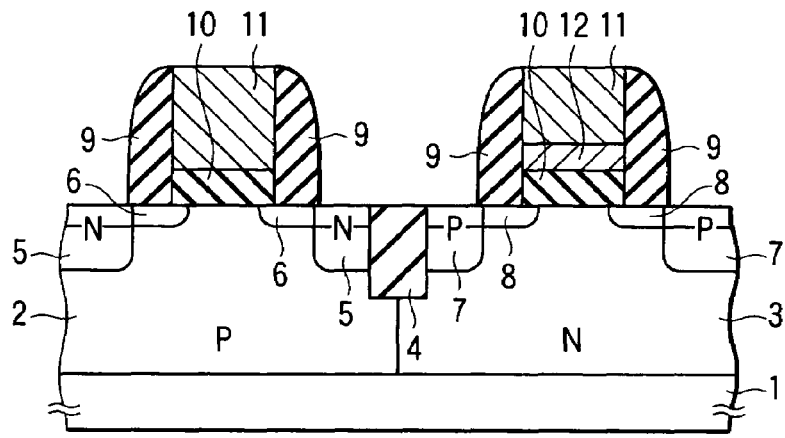
FIG. 20 is a sectional diagram showing a step of the manufacturing method of the device of FIG. 12.

Lastly, as shown in FIG. 20, through the normal LSI process, side wall insulating layers 9 are formed on side walls of the gate electrodes 11 and 12, an N-type diffusion layer 5 and an N-type extension layer 6 are formed in the P well area 2, and a P-type diffusion layer 7 and a P-type extension layer 8 are formed in the N well area 3.

Through the aforementioned process, the CMOS device of FIG. 12 is completed.

C. Manufacturing Method

SECOND EXAMPLE

Next, a second example of a manufacturing method of the CMOS device of FIG. 12 will be described by way of example in which a carbon compound (TaxCy) of tantalum (Ta) is used for the gate electrode of the P-channel MIS transistor.

Figure 21:
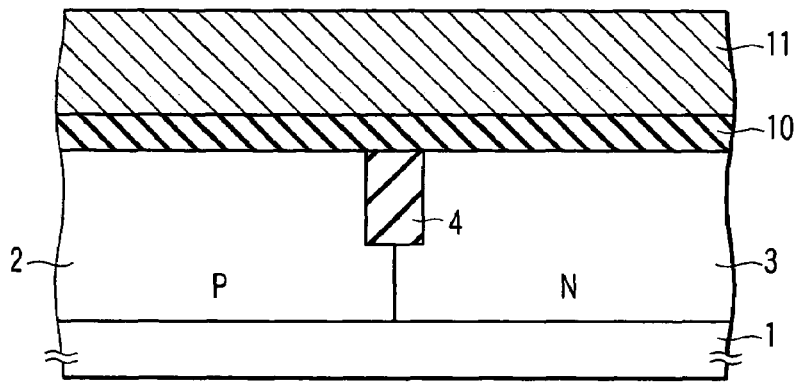
FIG. 21 is a sectional diagram showing a step of the manufacturing method of the device of FIG. 12.

First, as shown in FIG. 21, through a normal LSI process, a P-type well area 2, an N-type well area 3, and an element isolation layer 4 are formed in a semiconductor substrate 1. Subsequently, for example, a gate insulating layer 10 is formed by a MOCVD method.

For the gate insulating layer 10, a high dielectric of one selected from the group consisting of $SiO_2$, SiON, $TiO_2$, $HfO_2$, $Ta_2O_5$, $ZrO_2$, HfSiO, ZrSiO, HfSiON, ZrSiON, HfON, ZrON, $La_2O_3$, LaSiO, LaAlO, LaHfO, and TiAlO can be used.

Next, a silicon nitride 11 of a metal having a low work function, TaSiN according to the embodiment, is formed with a thickness of about 100 nm on the gate insulating layer 10.

The silicon nitride 11 of a metal can be formed by using a deposition method such as a sputtering method or a CVD method. According to the embodiment, to prevent damage of the gate insulating layer 10, the CVD method or the long throw sputtering method is preferably used.

Subsequently, as shown in FIG. 22, a photoresist 20 is formed on the silicon nitride 11 of a metal to cover an upper part of the P well area 2.

By using this photoresist 20 as a mask, carbon ions are implanted into the silicon nitride 11 of a metal by ion implantation to form a carbon ion area 21. In this case, for example, ion implantation conditions are acceleration energy 10 k of carbon ions, and a dose $1 \times 10^{16}$ $cm^{-2}$.

Subsequently, the photoresist 20 is removed by, e.g., an oxygen asher.

Next, as shown in FIG. 23, heat treatment is carried out in an inactive atmosphere of a temperature 200° C. to 400° C. for 1 hour.

As a result, carbons in the carbon ion area 21 shown in FIG. 22 are diffused in the silicon nitride of a metal which is a low work function material, and piled up near an interface between the gate insulating layer 10 and the silicon nitride 11 of a metal.

Execution of heat treatment at a temperature of 500° C. to 1100° C. causes chemical reaction between the piled-up carbons (C) and a part of the low work function material (TaSiN) to change the carbon compound of a metal (metal carbide hereinafter) 12 to TaxCy according to the embodiment. As a result, the metal carbide 12 is formed near the interface between the gate insulating layer 10 and the silicon nitride 11 of a metal.

Subsequently, through the same process as that of the first example of the manufacturing method (see FIGS. 18 to 20), the CMOS device of FIG. 12 is completed.

Thus, according to the first example of the manufacturing method, the metal carbide 12 is formed through the formation of the carbon layer by the sputtering method or the CVD method and the heat treatment. On the other hand, according to the second example of the manufacturing method, the metal carbide 12 is formed through the carbon ion implantation and the heat treatment.

The carbon ion implantation is an effective method as condition tuning or the like can be easily carried out as compared with the formation of the carbon layer by the sputtering method or the CVD method.

(3) Third Embodiment

A third embodiment is directed to a CMOS device in which an interface structure between a gate insulating layer and a gate electrode of a P-channel MIS transistor is similar to that of an N-channel MIS transistor.

A. Structure

Figure 26:
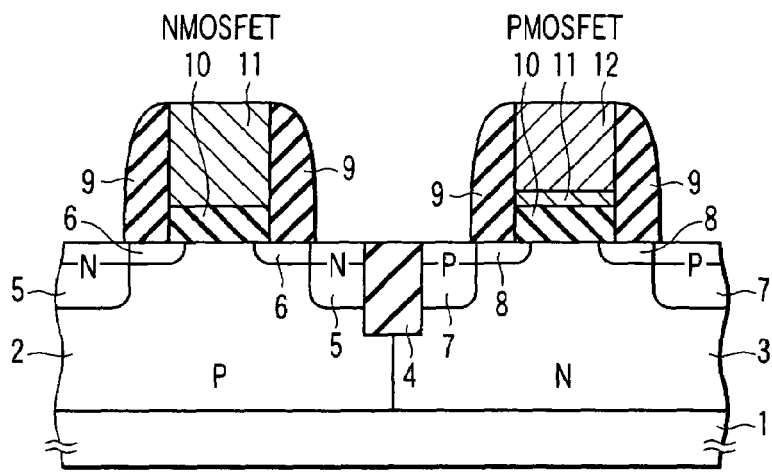
FIG. 26 is a sectional diagram showing a CMOS device according to a third embodiment.

FIG. 26 shows a sectional structure of the CMOS device according to the third embodiment of the present invention.

In a semiconductor substrate 1, a P-type well area 2 and an N-type well area 3 are arranged. The P-type and N-type well areas 2 and 3 are isolated from each other by an device isolation layer 4 of a STI structure.

The N-channel MIS transistor is arranged in the P-type well area 2.

The N-channel MIS transistor comprises an N-type diffusion layer 5, an N-type extension layer 6, a gate insulating layer 10, and a gate electrode 11. A side wall insulating layer 9 is formed on a side wall of the gate electrode 11.

As in the case of the first embodiment, for example, the gate electrode 11 of the N-channel MIS transistor is made of a low work function material which has a work function in a range of 4.10 eV to 4.40 eV. For the low work function material, a metal selected from the group consisting of Ti, Ta, Zr, Hf, V, Nb, Cr, Mo, W, La, and Y, or a boride, a silicide or a silicon nitride of such a metal is available.

From the standpoint of thermal stability and chemical stability for an LSI process, for the gate electrode of the N-channel MIS transistor, a boride or a silicon nitride of a metal selected from the group consisting of Ti, Ta, Zr, Hf, V, Nb, Cr, Mo, W, La, and Y is most preferably used.

The P-channel MIS transistor is arranged in the N-type well area 3.

The P-channel MIS transistor comprises a P-type diffusion layer 7, a P-type extension layer 8, a gate insulating layer 10, and gate electrodes 11, 12. Side wall insulating layers 9 are formed on side walls of the gate electrodes 11, 12.

The gate electrodes 11, 12 of the P-channel MIS transistor have laminated structures. The gate electrode 11 is made of a low work function material similar to that of the gate electrode 11 of the N-channel MIS transistor. For example, the gate electrode 12 is made of a high work function material which has a work function in a range of 4.80 eV to 5.10 eV.

For the high work function material, when an insulating material such as $SiO_2$ or HfSiON is used for the gate insulating layer 10, a carbon compound of a metal selected from the group consisting of Ti, Ta, Zr, Hf, V, Nb, Cr, Mo, W, La, and Y, is used.

Such a carbon compound of a metal has a melting point of above 2000° C., and is chemically inactive. Thus, from the standpoint of thermal stability and chemical stability for an LSI process, it is very excellent.

According to the embodiment, the gate electrode 11 is arranged between the gate insulating layer 10 and the gate electrode 12.

Thus, an interface between the gate insulating layer 10 and the gate electrodes 11, 12 of the P-channel MIS transistor employs a structure similar to that of the N-channel MIS transistor, i.e., a structure in which the low work function material is in contact with the gate insulating layer 10.

Accordingly, management of thermal budgets to maintain thermal stability on the interface between the gate insulating layer 10 and the gate electrodes 11, 12 is facilitated. By using a material such as TaSiN, TiSiN, or HfSiN having high interface stability with respect to the gate insulating layer 10 for a low work function material, it is possible to expand a range of materials selectable as metal carbides.

For example, as selection conditions of a metal carbide, priority is placed on a work function. Even when reaction with the gate insulating layer is feared, as there is a low work function material between the metal carbide and the gate insulating layer, it is possible to secure interface stability between the gate insulating layer 10 of the P-channel MIS transistor and the gate electrodes 11, 12.

Consideration will be given to a case of using Ti or HfC for a metal carbide. In this case, there is a possibility that these materials will generate $TiO_2$ or $HfO_2$ during, e.g., high-temperature heat treatment, to reduce $SiO_2$ of the gate insulating layer 10. According to the embodiment, however, as there is a low work function material, such as TiSiN or HfSiN, it is possible to prevent reduction of the insulating layer 10.

A work function of the gate electrodes 11, 12 can be decided mainly by the gate electrode 12 made of the metal carbide by setting a thickness of the gate electrode 11 made of the low work function material to 3 nm or less.

Thus, the work function of the gate electrodes 11, 12 is decided mainly by the gate electrode 12 made of the metal carbide, whereby setting of the work function of the P-channel MIS transistor is facilitated.

When the gate electrode 12 of the P-channel MIS transistor is made of the same metal as that of the gate electrode 11, e.g., Ta, the gate electrode 12 may employ a structure in which it is a part of the gate electrode 11, e.g., TaSiN, and carbon atoms (C) are contained in a part thereof.

As described above, according to the third embodiment, the gate electrode of the P-channel MIS transistor contains the carbon compound of a metal having a high work function. Thus, it is possible to provide a CMOS device having low resistance and high thermal stability, and a gate electrode in which problems of depletion or diffusion/penetration of impurities never occur.

Furthermore, according to the third embodiment, the interface structure between the gate insulating layer and the gate electrode of the P-channel MIS transistor is similar to that of the N-channel MIS transistor. Thus, great advantages can be provided in easy designing and easy processing of thermal budgets for guaranteeing thermal stability.

B. Manufacturing Method

Next, a manufacturing method of the CMOS device of FIG. 26 will be described by way of example in which a carbon compound ($Hf_xC_y$) of hafnium (Hf) is used for the gate electrode of the P-channel MIS transistor.

Figure 27:
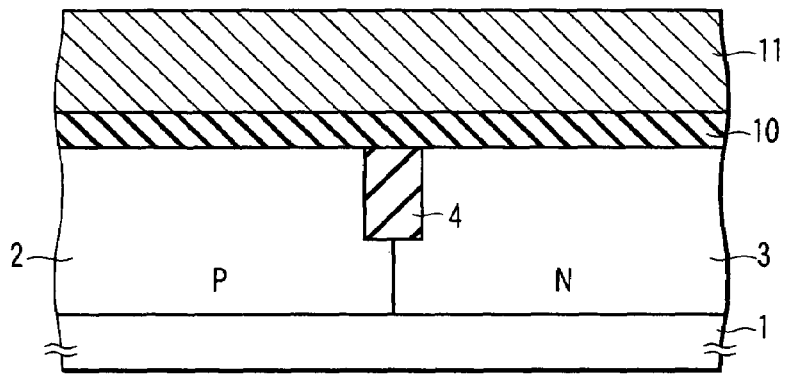
FIG. 27 is a sectional diagram showing a step of a manufacturing method of the device of FIG. 26.

First, as shown in FIG. 27, through a normal LSI process, a P-type well area 2, an N-type well area 3, and an element isolation layer 4 are formed in a semiconductor substrate 1.

Subsequently, for example, a gate insulating layer 10, e.g., HfSiON, is formed with a thickness of about 3 nm by a MOCVD method.

For the gate insulating layer 10, in addition to HfSiON, a high dielectric of one selected from the group consisting of $SiO_2$, SiON, $TiO_2$, $HfO_2$, $Ta_2O_5$, $ZrO_2$, HfSiO, ZrSiO, HfSiON, ZrSiON, HfON, ZrON, $La_2O_3$, LaSiO, LaAlO, LaHfO, and TiAlO can be used.

Figure 28:
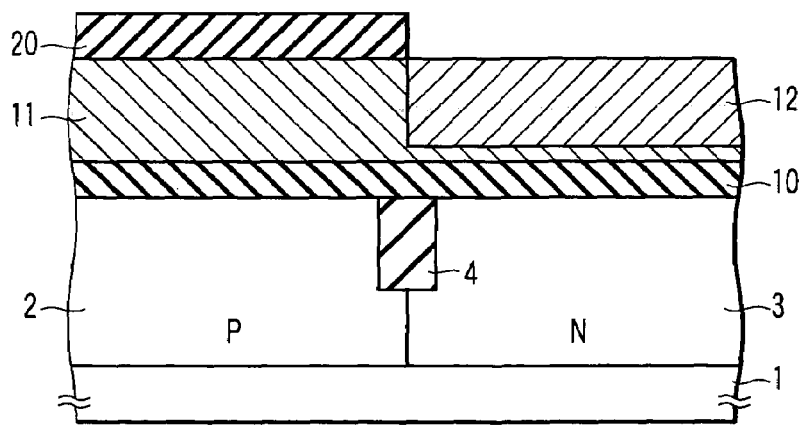
FIG. 28 is a sectional diagram showing a step of the manufacturing method of the device of FIG. 26.

Next, as shown in FIG. 28, for example, a low work function material, such as HfSiN, is formed with a thickness of about 10 nm on the gate insulating layer 10 by a sputtering method or a CVD method.

A mask material 20 made of photoresist is formed on the low work function material 11 to cover an upper part of the P-type well area 2. Then, by using this mask material 20 as a mask, carbon ions are implanted into the low work function material 11 by ion implantation to form a carbon ion area 12. Subsequently, the mask material 20 is removed.

Then, for example, annealing is carried out at a temperature of 600 to 1100° C. Carbons of the carbon ion area 12 are reacted with the metal in the low work function material 11 to change the carbon ion area 12 into a carbon compound of a metal (metal carbide hereinafter), i.e., HfC.

Through this annealing, an upper part of the low work function material 11 becomes a metal carbide (HfC) 12, and a portion brought into contact with the gate insulating layer 10 is maintained as a low work function material (HfSiN) 11. In this case, above the N well region 3, the metal carbide 12 is controlled to be thicker than the low work function material 11, and a thickness of the low work function material 11 is controlled to be 3 nm or less.

Next, as shown in FIG. 29, a photoresist 17 is formed by PEP to process the gate electrode. By using this photoresist 17 as a mask, the low work function material 11, the metal carbide 12, and the gate insulating layer 10 are etched. Subsequently, the photoresist 17 is removed.

As a result, the gate insulating layer 10 and the gate electrode 11 made of the low work function material are formed on the P well area 2, and the gate insulating layer 10 and the gate electrodes 11, 12 made of the low work function material and the metal carbide are formed on the N well area 3.

According to the embodiment, for example, the gate electrode 11 of the N-channel MIS transistor is made of HfSiN, and the gate electrodes 11, 12 of the P-channel MIS transistor are constituted of stacked layers of HfSiN and HfC in this case.

That is, as the interface structure between the gate insulating layer and the gate electrode of the P-channel MIS transistor is similar to that of the N-channel MIS transistor, thermal budget designing and processing for guaranteeing thermal stability is facilitated.

When a thickness of the gate electrode (HfSiN) 11 of the N-channel MIS transistor is about 10 nm, a thickness of the gate electrode (HfSiN) 11 of the P-channel MIS transistor is preferably set to a value of 7 nm or more, and a thickness of the gate electrode (HfC) 12 is preferably set to a value of 3 nm or more.

Lastly, as shown in FIG. 30, through the normal LSI process, side wall insulating layers 9 are formed on side walls of the gate electrodes 11 and 12, an N-type diffusion layer 5 and an N-type extension layer 6 are formed in the P well area 2, and a P-type diffusion layer 7 and a P-type extension layer 8 are formed in the N well area 3.

Through the aforementioned process, the CMOS device of FIG. 26 is completed.

(4) Fourth Embodiment

A fourth embodiment is an improved example of the first embodiment. A CMOS device of the fourth embodiment has a feature that uppermost layers of gate electrodes of P and N-channel MIS transistors are made of semiconductors (Si, SiGe or the like).

A. Structure

FIG. 31 shows a sectional structure of the CMOS device according to the fourth embodiment of the present invention.

In a semiconductor substrate 1, a P-type well area 2 and an N-type well area 3 are arranged. The P-type and N-type well areas 2 and 3 are isolated from each other by an device isolation layer 4 of a STI structure.

The N-channel MIS transistor is arranged in the P-type well area 2.

The N-channel MIS transistor comprises an N-type diffusion layer 5, an N-type extension layer 6, a gate insulating layer 10, and gate electrodes 11, 13A. Side wall insulating layers 9 are formed on side walls of the gate electrodes 11, 13A.

For example, the gate electrodes 11, 13A of the N-channel MIS transistor are constituted of stacked layers of a low work function material 11 which has a work function in a range of 4.10 eV to 4.40 eV, and a conductive semiconductor 13A, e.g., polysilicon containing N-type impurities, formed on the low work function material 11.

The P-channel MIS transistor is arranged in the N-type well area 3.

The P-channel MIS transistor comprises a P-type diffusion layer 7, a P-type extension layer 8, a gate insulating layer 10, and gate electrodes 12, 13B. Side wall insulating layers 9 are formed on side walls of the gate electrodes 12, 13B.

For example, the gate electrodes 12, 13B of the P-channel MIS transistor are constituted of stacked layers of a high work function material which has a work function in a range of 4.80 eV to 5.10 eV, and a conductive semiconductor 13B, e.g., polysilicon containing P-type impurities, on the high work function material 12.

As described above, according to the first embodiment, as in the case of the first embodiment, it is possible to realize a gate electrode structure having low resistance and thermal stability in which problems of depletion or diffusion/penetration of impurities never occur, and by making the uppermost layer of the gate electrode of the semiconductor, effects such as increases in heat resistance and corrosion resistance and process facilitation can be provided.

B. Manufacturing Method

Next, a manufacturing method of the CMOS device of FIG. 31 will be described by way of example in which a carbon compound (TaxCy) of tantalum (Ta) is used for the gate electrode of the P-channel MIS transistor.

First, as shown in FIG. 32, through a normal LSI process, a P-type well area 2, an N-type well area 3, and an element isolation layer 4 are formed in a semiconductor substrate 1. Subsequently, for example, a gate insulating layer 10 is formed by a MOCVD method.

Next, as shown in FIG. 33, for example, a silicon nitride is formed with a thickness of about 300 nm on the gate insulating layer 10 by a LPCVD method. Subsequently, this silicon nitride is patterned by PEP to form a mask material 16 made of silicon nitride on the P-type well area 2.

Next, as shown in FIG. 34, a carbon compound of a metal (metal carbide hereinafter) 12, TaxCy according to the embodiment, is formed with a thickness of about 100 nm on the gate insulating layer 10 and the mask material 16.

In this case, the metal carbide 12 can be formed by using a deposition method such as a sputtering method or a CVD method as in the case of the first embodiment.

Figure 35:
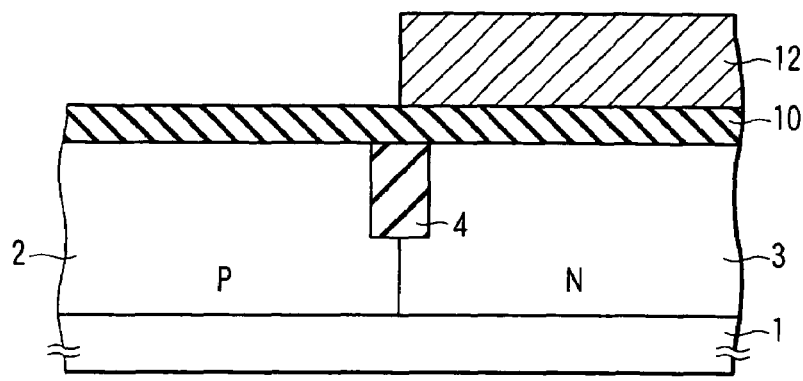
FIG. 35 is a sectional diagram showing a step of the manufacturing method of the device of FIG. 31.

Next, as shown in FIG. 35, by a lift-off method, the metal carbide 12 on the mask material 16 is peeled off together with the mask material 16 shown in FIG. 34. For example, by using a hot sulfuric acid to peel off the mask material 16 made of the silicon nitride, the metal carbide 12 thereon can be simultaneously peeled off. In this case, the metal carbide on the N-type well area 3 will not be peeled off as it is in a chemically stable state.

Figure 36:
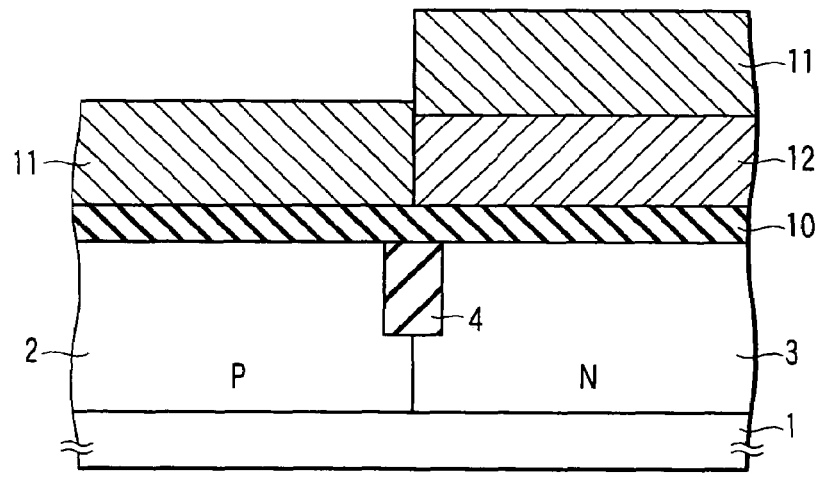
FIG. 36 is a sectional diagram showing a step of the manufacturing method of the device of FIG. 31.

Next, as shown in FIG. 36, a silicon nitride 11 of a metal having a low work function, TaSiN according to the embodiment, is formed with a thickness of about 120 nm on the gate insulating layer 10 and the metal carbide 12.

In this case, the silicon nitride 11 of a metal can be formed by using the deposition method such as the sputtering method or the CVD method as in the case of the first embodiment.

Figure 37:
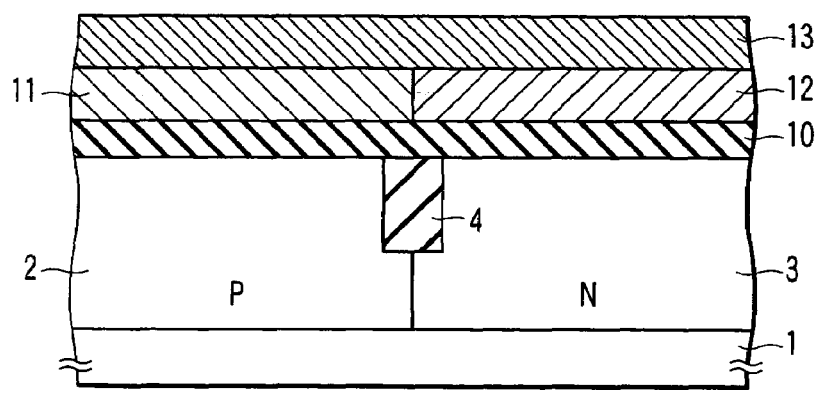
FIG. 37 is a sectional diagram showing a step of the manufacturing method of the device of FIG. 31.

Next, as shown in FIG. 37, the silicon nitride 11 of a metal is polished by using a planarizing method such as a CMP method to remove the silicon nitride 11 of a metal from above the N-type well area 3.

For example, by a LPCVD method, a semiconductor 13, e.g., polysilicon, is formed on the silicon nitride 11 of a metal and the metal carbide 12.

Figure 38:
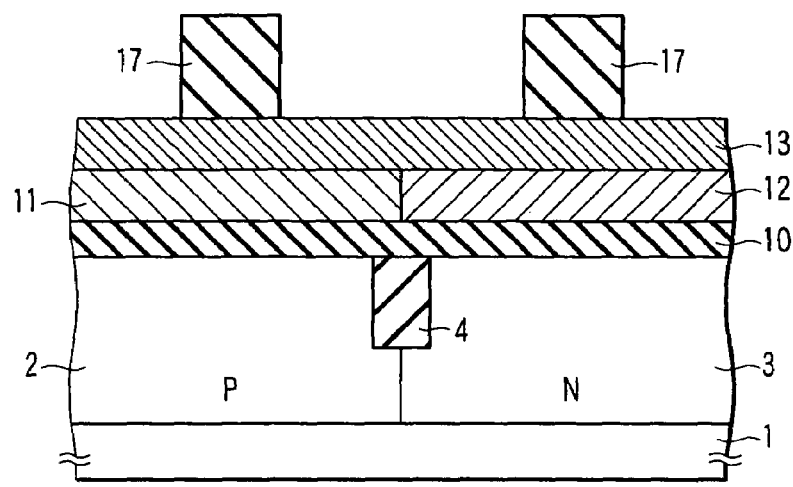
FIG. 38 is a sectional diagram showing a step of the manufacturing method of the device of FIG. 31.

Next, as shown in FIG. 38, a photoresist 17 is formed by PEP to process the gate electrode. By using this photoresist 17 as a mask, the silicon nitride 11 of a metal, the metal carbide 12, the gate insulating layer 10, and the semiconductor 13 are etched. Subsequently, the photoresist 17 is removed.

Figure 39:
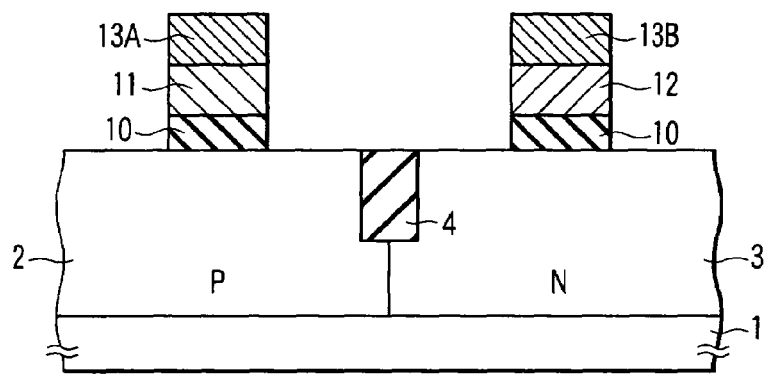
FIG. 39 is a sectional diagram showing a step of the manufacturing method of the device of FIG. 31.

As a result, as shown in FIG. 39, the gate insulating layer 10, the gate electrode 11 of a low work function, and the gate electrode 13A made of the semiconductor are formed on the P well area 2, and the gate insulating layer 10, the gate electrode 12 made of the metal carbide (TaxCy), and the gate electrode 13B made of the semiconductor are formed on the N well area 3.

Figure 40:
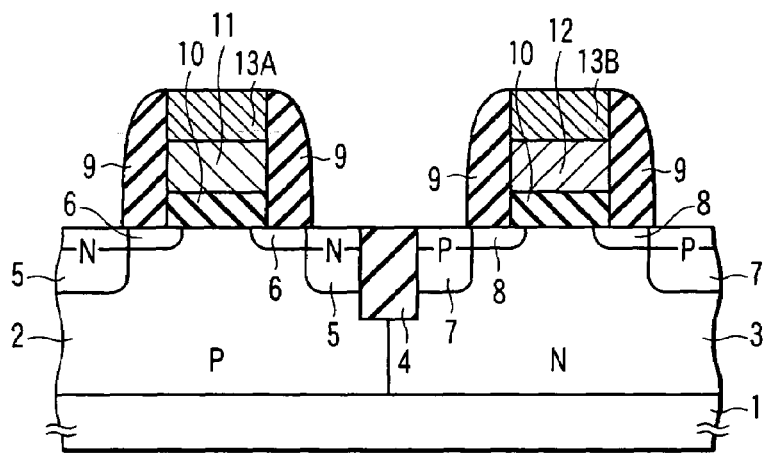
FIG. 40 is a sectional diagram showing a step of the manufacturing method of the device of FIG. 31.

Lastly, as shown in FIG. 40, through the normal LSI process, side wall insulating layers 9 are formed on side walls of the gate electrodes 11, 12, 13A, and 13B, an N-type diffusion layer 5 and an N-type extension layer 6 are formed in the P well area 2, and a P-type diffusion layer 7 and a P-type extension layer 8 are formed in the N well area 3.

Through the aforementioned process, the CMOS device of FIG. 31 is completed.

As described above, according to the embodiment, the uppermost layers of the gate electrodes 11, 13A of the N-channel MIS transistor and the uppermost layers of the gate electrodes 12, 13B of the P-channel MIS transistor are made of semiconductors.

Thus, for example, conditions of annealing for activating impurities in the N-type layer 5, the N-type extension layer 6, the P-type diffusion layer 7, and the P-type extension layer 8 and recovering from damage during ion implantation can be softened to conditions used for a normal polysilicon gate.

Furthermore, it is possible to provide effects of improving a current drive current of the MIS transistor constituting the CMOS device and long-time reliability of the gate insulating layer.

(5) Fifth Embodiment

A fifth embodiment is an improved example of the second embodiment. A CMOS device of the fifth embodiment has a feature that uppermost layers of gate electrodes of P and N-channel MIS transistors are made of semiconductors (Si, SiGe or the like).

A. Structure

Figure 41:
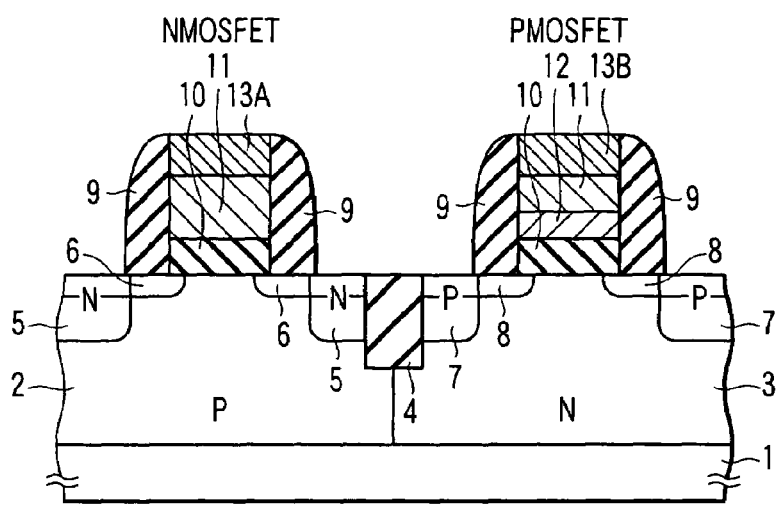
FIG. 41 is a sectional diagram showing a CMOS device according to a fifth embodiment.

FIG. 41 shows a sectional structure of the CMOS device according to the fifth embodiment of the present invention.

In a semiconductor substrate 1, a P-type well area 2 and an N-type well area 3 are arranged. The P-type and N-type well areas 2 and 3 are isolated from each other by an device isolation layer 4 of a STI structure.

The N-channel MIS transistor is arranged in the P-type well area 2.

The N-channel MIS transistor comprises an N-type diffusion layer 5, an N-type extension layer 6, a gate insulating layer 10, and gate electrodes 11, 13A. Side wall insulating layers 9 are formed on side walls of the gate electrodes 11, 13A.

For example, the gate electrodes 11, 13A of the N-channel MIS transistor are constituted of stacked layers of a low work function material 11 which has a work function in a range of 4.10 eV to 4.40 eV, and a conductive semiconductor 13A, e.g., polysilicon containing N-type impurities, formed on the low work function material 11.

The P-channel MIS transistor is arranged in the N-type well area 3.

The P-channel MIS transistor comprises a P-type diffusion layer 7, a P-type extension layer 8, a gate insulating layer 10, and gate electrodes 11, 12, and 13B. Side wall insulating layers 9 are formed on side walls of the gate electrodes 11, 12, and 13B.

The gate electrodes 11, 12, and 13B of the P-channel MIS transistor have a laminated structure. The gate electrode 11 is made of the same low work function material as that of the gate electrode 11 of the N-channel MIS transistor. The gate electrode 12 is arranged between the gate insulating layer 10 and the gate electrode 11, and made of, e.g., a high work function material which has a work function in a range of 4.80 eV to 5.10 eV.

The gate electrode 13B is formed on the gate electrode 11, and made of a conductive semiconductor, e.g., polysilicon containing N-type impurities.

As described above, according to the fifth embodiment, as in the case of the second embodiment, it is possible to realize a gate electrode structure having low resistance and thermal stability in which problems of depletion or diffusion/penetration of impurities never occur, and by making the uppermost layer of the gate electrode of the semiconductor, effects such as increases in heat resistance and corrosion resistance and process facilitation can be provided.

B. Manufacturing Method

Next, a manufacturing method of the CMOS device of FIG. 41 will be described by way of example in which a carbon compound (TaxCy) of tantalum (Ta) is used for the gate electrode of the P-channel MIS transistor.

Figure 42:
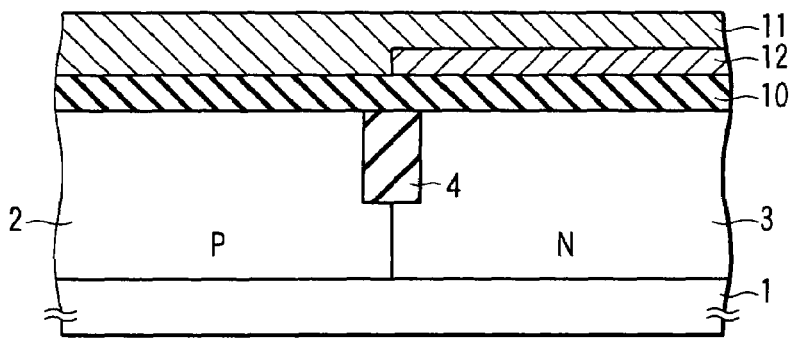
FIG. 42 is a sectional diagram showing a step of a manufacturing method of the device of FIG. 41.

First, as shown in FIG. 42, a process up to formation of a silicon nitride 11 of a metal and a metal carbide 12 on the gate insulating layer 10 is carried out by the same method as that of the second embodiment, e.g., the manufacturing method (First Example).

Figure 43:
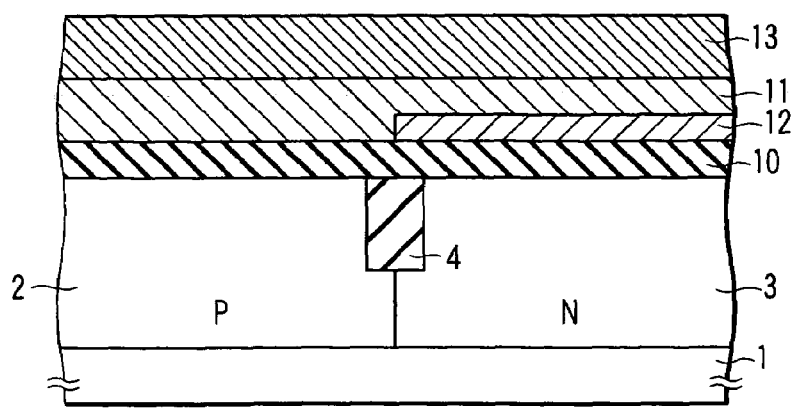
FIG. 43 is a sectional diagram showing a step of the manufacturing method of the device of FIG. 41.

Next, as shown in FIG. 43, for example, by a LPCVD method, a semiconductor 13, e.g., polysilicon, is formed on the silicon nitride 11 of a metal.

Next, as shown in FIG. 44, a photoresist 17 is formed by PEP to process the gate electrode. By using this photoresist 17 as a mask, the semiconductor 13 is etched by RIE.

As a result, as shown in FIG. 45, the gate electrode 13A is formed on the P well area 2, and the gate electrode 13B is formed on the N well area 3. Subsequently, the photoresist 17 is removed.

Next, as shown in FIG. 46, by using the gate electrodes 13A, 13B as masks, the silicon nitride 11 of a metal, the metal carbide 12, and the gate insulating layer 10 are etched by RIE.

Accordingly, the gate insulating layer 10 and the gate electrodes 11, 13A made of the silicon nitride of a metal and the semiconductor arte formed on the P well area 2. The gate insulating layer 10 and the gate electrodes 11, 12, and 13B constituted of laminated layers of the metal carbide (TaxCy), the silicon nitride of a metal and the semiconductor are formed on the N well area 3.

Figure 47:
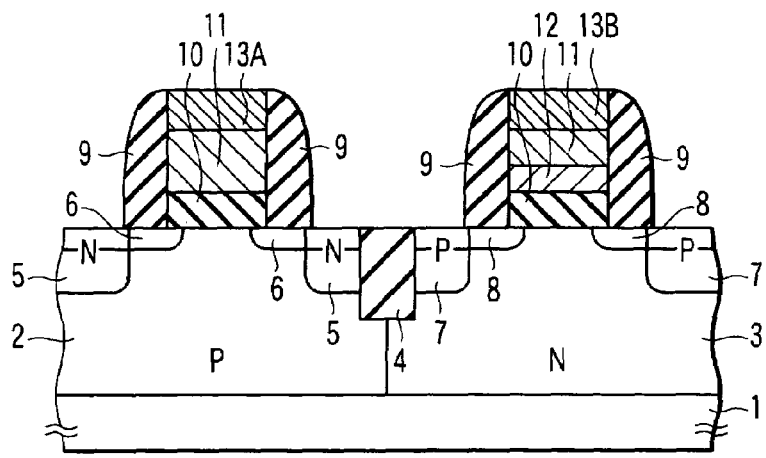
FIG. 47 is a sectional diagram showing a step of the manufacturing method of the device of FIG. 41.

Lastly, as shown in FIG. 47, through the normal LSI process, side wall insulating layers 9 are formed on side walls of the gate electrodes 11, 12, 13A, and 13B, an N-type diffusion layer 5 and an N-type extension layer 6 are formed in the P well area 2, and a P-type diffusion layer 7 and a P-type extension layer 8 are formed in the N well area 3.

Through the aforementioned process, the CMOS device of FIG. 41 is completed.

The manufacturing method of the embodiment is based on the manufacturing method (First Example) of the second embodiment. Needless to say, however, the CMOS device of FIG. 41 can be formed based on the manufacturing method (Second Example).

(4) Sixth Embodiment

A sixth embodiment is an improved example of the third embodiment. A CMOS device of the sixth embodiment has a feature that uppermost layers of gate electrodes of P and N-channel MIS transistors are made of semiconductors (Si, SiGe or the like).

A. Structure

Figure 48:
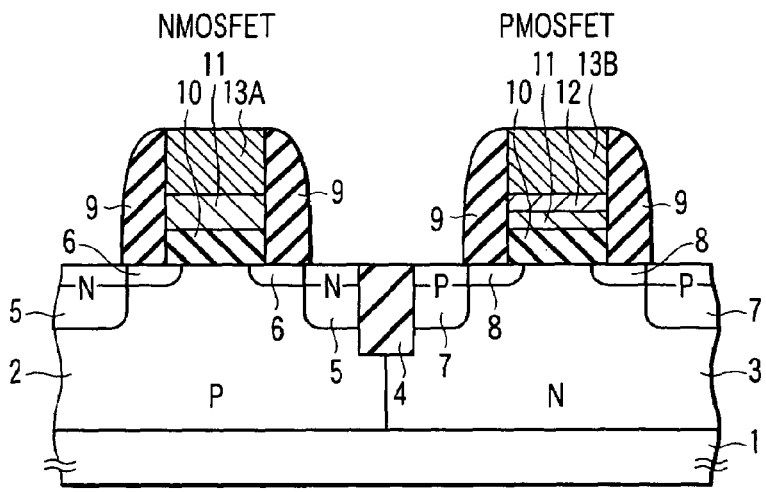
FIG. 48 is a sectional diagram showing a CMOS device according to a sixth embodiment.

FIG. 48 shows a sectional structure of the CMOS device according to the sixth embodiment of the present invention.

In a semiconductor substrate 1, a P-type well area 2 and an N-type well area 3 are arranged. The P-type and N-type well areas 2 and 3 are isolated from each other by an device isolation layer 4 of a STI structure.

The N-channel MIS transistor is arranged in the P-type well area 2.

The N-channel MIS transistor comprises an N-type diffusion layer 5, an N-type extension layer 6, a gate insulating layer 10, and gate electrodes 11, 13A. Side wall insulating layers 9 are formed on side walls of the gate electrodes 11, 13A.

For example, the gate electrodes 11, 13A of the N-channel MIS transistor are constituted of stacked layers of a low work function material 11 which has a work function in a range of 4.10 eV to 4.40 eV, and a conductive semiconductor 13A, e.g., polysilicon containing N-type impurities, formed on the low work function material 11.

The P-channel MIS transistor is arranged in the N-type well area 3.

The P-channel MIS transistor comprises a P-type diffusion layer 7, a P-type extension layer 8, a gate insulating layer 10, and gate electrodes 11, 12, and 13B. Side wall insulating layers 9 are formed on side walls of the gate electrodes 11, 12, and 13B.

The gate electrodes 11, 12, and 13B of the P-channel MIS transistor have a laminated structure. The gate electrode 11 is made of the same low work function material as that of the gate electrode 11 of the N-channel MIS transistor. The gate electrode 12 is made of, e.g., a high work function material which has a work function in a range of 4.80 eV to 5.10 eV.

The gate electrode 13B is formed on the gate electrode 12, and made of a conductive semiconductor e.g., polysilicon containing P-type impurities.

As described above, according to the sixth embodiment, as in the case of the third embodiment, it is possible to realize a gate electrode structure having low resistance and thermal stability in which problems of depletion or diffusion/penetration of impurities never occur, and by making the uppermost layer of the gate electrode of the semiconductor, effects such as increases in thermal stability and corrosion resistance and process facilitation can be provided.

B. Manufacturing Method

Next, a manufacturing method of the CMOS device of FIG. 48 will be described by way of example in which a carbon compound (HfxCy) of hafnium (Hf) is used for the gate electrode of the P-channel MIS transistor.

Figure 49:
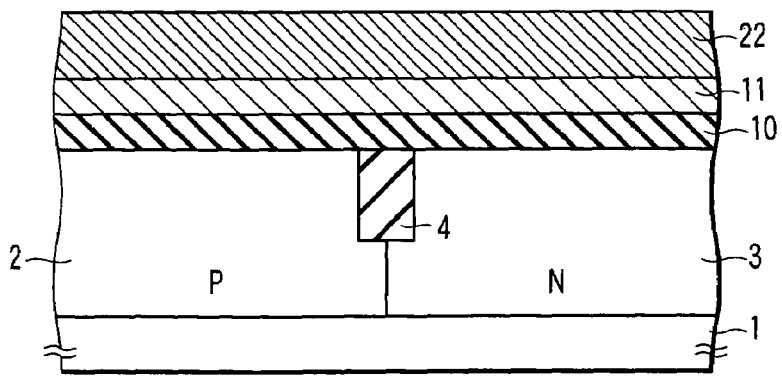
FIG. 49 is a sectional diagram showing a step of a manufacturing method of the device of FIG. 48.

First, as shown in FIG. 49, through a normal LSI process, a P-type well area 2, an N-type well area 3, and an element isolation layer 4 are formed in a semiconductor substrate 1. Subsequently, for example, a gate insulating layer 10 is formed with a thickness of about 3 nm by a MOCVD method.

Then, a low work function material 11, e.g., HfSiN, is formed with a thickness of about 10 nm on the gate insulating layer by using a deposition method such as a sputtering method or a CVD method. Subsequently, for example, by a LPCVD method, a semiconductor 22, e.g., polysilicon, is formed on the low work function material 11.

Figure 50:
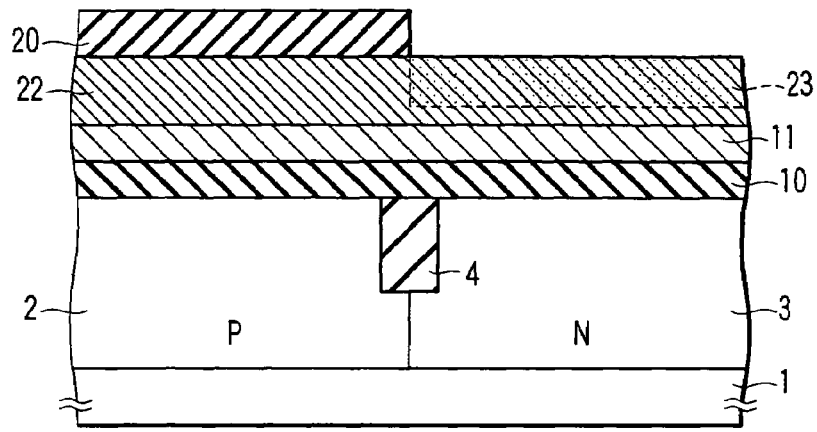
FIG. 50 is a sectional diagram showing a step of the manufacturing method of the device of FIG. 48.

Next, as shown in FIG. 50, a mask material 20 made of a photoresist is formed on the semiconductor 22 to cover an upper part of the P-type well area 2. Then, by using this mask material 20 as a mask, carbon ions are implanted into the semiconductor 22 by ion implantation to form a carbon ion area 23. Subsequently, the mask material 20 is removed.

Figure 51:
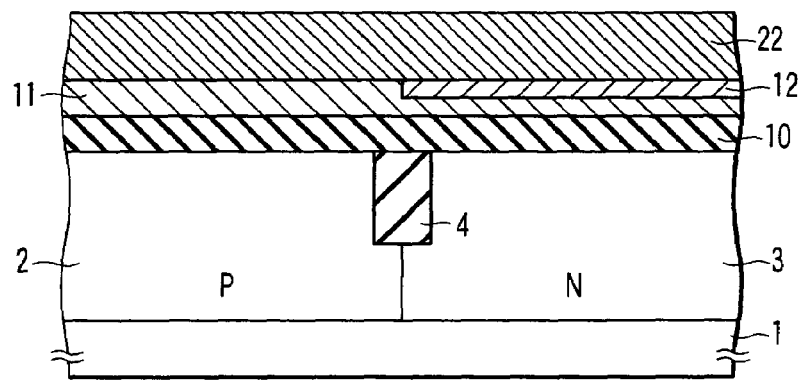
FIG. 51 is a sectional diagram showing a step of the manufacturing method of the device of FIG. 48.

Next, as shown in FIG. 51, for example, heat treatment is carried out at a temperature of 200 to 400° C. for about 1 hour to pile up carbon atoms on an interface between the low work function material 11 and the semiconductor 13. Subsequently, annealing is carried out at a temperature of 600 to 1100° C. The metal in the low work function material 11 is reacted with the carbons to form a carbon compound (metal carbide hereinafter) 12 of a metal, e.g., HfC, between the low work function material 11 and the semiconductor 13.

Through this annealing, an upper part of the low work function material 11 becomes a metal carbide (HfC) 12, and a portion brought into contact with the gate insulating layer 10 is maintained as the low work function material (HfSiN) 11. In this case, the metal carbide 12 is controlled to be thicker than the low work function material 11 above the N-type well are 3, and a thickness of the low work function material is controlled to be 3 nm or less.

Figure 52:
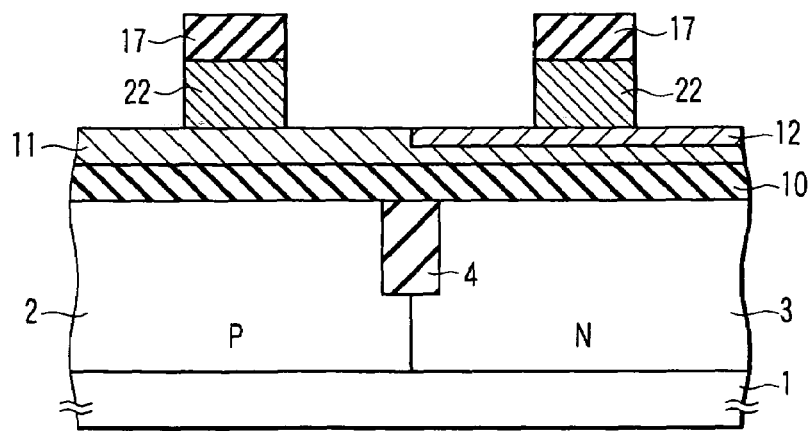
FIG. 52 is a sectional diagram showing a step of the manufacturing method of the device of FIG. 48.

Next, as shown in FIG. 52, a photoresist 17 is formed by PEP to process the gate electrode. By using this photoresist 17 as a mask, the semiconductor 22 is etched by RIE.

Figure 53:
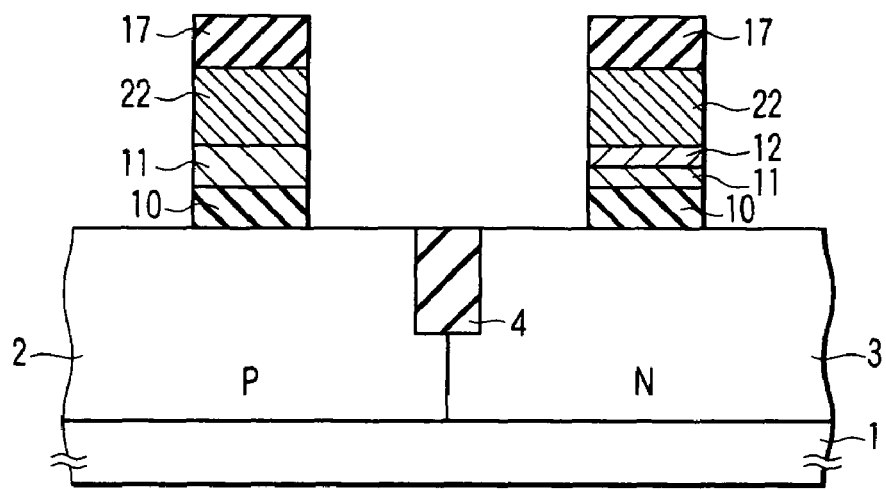
FIG. 53 is a sectional diagram showing a step of the manufacturing method of the device of FIG. 48.

Subsequently, as shown in FIG. 53, by using the photoresist 17 as a mask, the silicon nitride 11 of a metal, the metal carbide 12, and the gate insulating layer 10 are etched by RIE.

As a result, the gate insulating layer 10, and the gate electrodes 11, 13A made of the silicon nitride of a metal and the semiconductor are formed on the P well area 2, and the gate insulating layer 10, and the gate electrodes 11, 12 and 13B constituted of stacked layers of the metal carbide (TaxCy), the silicon nitride of the metal and the semiconductor are formed on the N well area 3.

Subsequently, the photoresist 17 is removed.

Figure 54:
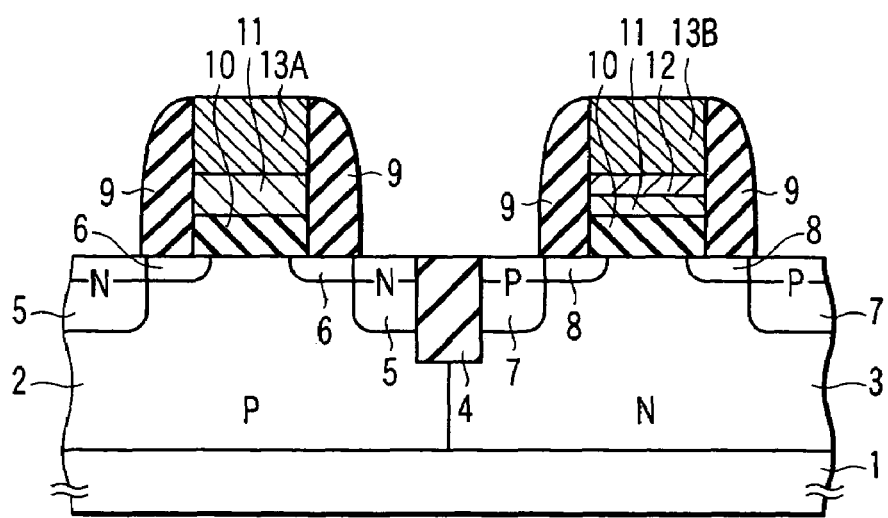
FIG. 54 is a sectional diagram showing a step of the manufacturing method of the device of FIG. 48.

Lastly, as shown in FIG. 54, through the normal LSI process, side wall insulating layers 9 are formed on side walls of the gate electrodes 11, 12, 13A, and 13B, an N-type diffusion layer 5 and an N-type extension layer 6 are formed in the P well area 2, and a P-type diffusion layer 7 and a P-type extension layer 8 are formed in the N well area 3.

Through the aforementioned process, the CMOS device of FIG. 48 is completed.

3. Others

As described above, according to the embodiments of the present invention, it is possible to provide a CMOS device having low resistance and thermal stability, and a gate electrode in which problems of depletion, diffusion of impurities and penetration never occur, and a manufacturing method of no increases in the number of steps or complexity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
a P-channel MIS transistor which includes an N-type semiconductor layer, a first gate insulating layer formed on the N-type semiconductor layer, and a first gate electrode formed on the first gate insulating layer and containing a carbon compound area and a conductive area different from the carbon compound area; and
an N-channel MIS transistor which includes a P-type semiconductor layer, a second gate insulating layer formed on the P-type semiconductor layer, and a second gate electrode formed on the second gate insulating layer,
wherein the carbon compound area is comprised of one of Ta carbide and W carbide, and the conductive area and the second gate electrode are made of the same material.

2. The semiconductor device according to claim 1, wherein the second gate electrode is made of a metal selected from the group consisting of Ti, Ta, Zr, Hf, V, Nb, Cr, Mo, W, La, and Y, or a boride, a silicide, or a silicon nitride of the metal.

3. The semiconductor device according to claim 1, wherein each of the first gate insulating layer and the first gate electrode is made of such a material that a work function of the first gate electrode takes a value suitable for the P-channel MIS transistor.

4. The semiconductor device according to claim 1, wherein each of the first and second gate electrodes has a laminated structure, and an uppermost layer thereof is made of one of Si and SiGe.

5. The semiconductor device according to claim 1, wherein the carbon compound area is comprised of TaxCy, where x and y constitute a composition ratio.

6. The semiconductor device according to claim 1, wherein the first gate insulating layer is one selected from the group consisting of $SiO_2$, SiON, $TiO_2$, $HfO_2$, $Ta_2O_5$, $ZrO_2$, HfSiO, ZrSiO, HfSiON, ZrSiON, HfON, ZrON, $La_2O_3$, LaSiO, LaAlO, LaHfO, and TiAlO.

7. The semiconductor device according to claim 1, wherein the work function of the carbon compound has a value between 4.7 and 5.0 eV.

8. A semiconductor device comprising:
a P-channel MIS transistor which includes an N-type semiconductor layer, a first gate insulating layer formed on the N-type semiconductor layer, and a first gate electrode formed on the first gate insulating layer and in which a carbon compound of a metal is present on an interface between the first gate insulating layer and the first gate electrode; and an N-channel MIS transistor which includes a P-type semiconductor layer, a second gate insulating layer formed on the P-type semiconductor layer, and a second gate electrode formed on the second gate insulating layer, wherein the carbon compound is comprised of one of Ta carbide and W carbide, and the first and second gate electrodes are made of the same material.

9. The semiconductor device according to claim 8, wherein each of the first and the second gate electrodes is made of a metal selected from the group consisting of Ti, Ta, Zr, Hf, V, Nb, Cr, Mo, W, La, and Y, or a boride, a silicide, or a silicon nitride of the metal.

10. The semiconductor device according to claim 8, wherein each of the first gate insulating layer, the first gate electrode, and the carbon compound of a metal is made of such a material that a work function of the first gate electrode takes a value suitable for the P-channel MIS transistor.

11. The semiconductor device according to claim 8, wherein each of the first and second gate electrodes has a laminated structure, and an uppermost layer thereof is made of one of Si and SiGe.

12. The semiconductor device according to claim 9, wherein the first gate insulating layer is one selected from the group consisting of $SiO_2$, SiON, $TiO_2$, $HfO_2$, $Ta_2O_5$, $ZrO_2$, HfSiO, ZrSiO, HfSiON, ZrSiON, HfON, ZrON, $La_2O_3$, LaSiO, LaAlO, LaHfO, and TiAlO.

13. The semiconductor device according to claim 8, wherein the carbon compound area is set in a crystal state, and the carbon compound area adjacent to the first gate insulating layer is oriented to (111).

14. A semiconductor device comprising:

a P-channel MIS transistor which includes an N-type semiconductor layer, a first gate insulating layer formed on the N-type semiconductor layer, and a first gate electrode formed on the first gate insulating layer and in which a carbon compound of a metal is present on a portion different from an interface between the first gate insulating layer and the first gate electrode; and an N-channel MIS transistor which includes a P-type semiconductor layer, a second gate insulating layer formed on the P-type semiconductor layer, and a second gate electrode formed on the second gate insulating layer, wherein the interface has no carbon compound and the first and second gate electrodes are made of the same material.

15. The semiconductor device according to claim 14, wherein each of the first and the second gate electrodes is made of a metal selected from the group consisting of Ti, Ta, Zr, Hf, V, Nb, Cr, Mo, W, La, and Y, or a boride, a silicide, or a silicon nitride of the metal.

16. The semiconductor device according to claim 14, wherein each of the first gate insulating layer, the first gate electrode, and the carbon compound of a metal is made of such a material that a work function of the first gate electrode takes a value suitable for the P-channel MIS transistor.

17. The semiconductor device according to claim 14, wherein the first gate electrode is formed such that a thickness of the portion of the carbon compound of a metal is thinner than those of other portions, and the thickness of the portion of the carbon compound of a metal is 3 nm or less.

18. The semiconductor device according to claim 14, wherein each of the first and second gate electrodes has a laminated structure, and an uppermost layer thereof is made of one of Si and SiGe.

19. The semiconductor device according to claim 14, wherein the metal is one selected from the group consisting of Ti, Ta, Zr, Hf, V, Nb, Cr, Mo, W, La, and Y.

20. The semiconductor device according to claim 14, wherein the first gate insulating layer is one selected from the group consisting of $SiO_2$, SiON, $TiO_2$, $HfO_2$, $Ta_2O_5$, $ZrO_2$, HfSiO, ZrSiO, HfSiON, ZrSiON, HfON, ZrON, $La_2O_3$, LaSiO, LaAlO, LaHfO, and TiAlO.

21. The semiconductor device according to claim 14, wherein a thickness of the first gate electrode between the carbon compound and the first gate insulating layer is set to 3 nm or less.

* * * * *